US010810962B2

(12) United States Patent
Ono et al.

(10) Patent No.: US 10,810,962 B2
(45) Date of Patent: Oct. 20, 2020

(54) SHIFT REGISTER CIRCUIT AND DISPLAY PANEL

(71) Applicant: Mitsubishi Electric Corporation, Chiyoda-ku (JP)

(72) Inventors: Takeshi Ono, Tokyo (JP); Masafumi Agari, Tokyo (JP); Toshiaki Fujino, Tokyo (JP); Shinji Kawabuchi Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 26 days.

(21) Appl. No.: 16/311,362

(22) PCT Filed: May 25, 2017

(86) PCT No.: PCT/JP2017/019541
§ 371 (c)(1),
(2) Date: Dec. 19, 2018

(87) PCT Pub. No.: WO2018/016178
PCT Pub. Date: Jan. 25, 2018

(65) Prior Publication Data
US 2019/0251921 A1 Aug. 15, 2019

(30) Foreign Application Priority Data
Jul. 20, 2016 (JP) ................ 2016-142166

(51) Int. Cl.
*G11C 19/00* (2006.01)
*G09G 3/36* (2006.01)
(Continued)

(52) U.S. Cl.
CPC ............ *G09G 3/3677* (2013.01); *G09G 3/20* (2013.01); *G09G 3/36* (2013.01); *G11C 19/184* (2013.01);
(Continued)

(58) Field of Classification Search
None
See application file for complete search history.

(56) References Cited

U.S. PATENT DOCUMENTS 9,299,296 B2 * 3/2016 Yamazaki ............ G11C 19/28
9,548,133 B2 * 1/2017 Hirose .................. G11C 19/28
(Continued)

FOREIGN PATENT DOCUMENTS

JP         11-68548 A     3/1999
JP      2000-261304 A     9/2000
(Continued)

OTHER PUBLICATIONS

International Search Report dated Aug. 1, 2017 in PCT/JP2017/019541 filed May 25, 2017.

*Primary Examiner* — Tuan T Lam
(74) *Attorney, Agent, or Firm* — Xsensus LLP

(57) ABSTRACT

A shift register circuit that controls back gate voltage of a transistor with a simple configuration and at a low cost, and a display panel. In the shift register circuit, shift registers include: an output circuit, a charge and discharge circuit, a first power supply terminal, and at least one back gate voltage generation circuit. The output circuit or the charge and discharge circuit includes at least one transistor. The back gate voltage generation circuit includes a back gate node. The back gate node is connected to the back gate electrode of the transistor. The back gate voltage generation circuit changes a voltage of the back gate node according to a voltage of a gate electrode of the transistor. The back gate voltage generation circuit is supplied with a drive voltage from the first power supply terminal.

17 Claims, 26 Drawing Sheets

(51) Int. Cl.
  *G11C 19/28* (2006.01)
  *G09G 3/20* (2006.01)
  *H03K 17/30* (2006.01)
  *G11C 19/18* (2006.01)

(52) U.S. Cl.
  CPC ............ *G11C 19/28* (2013.01); *G11C 19/287* (2013.01); *H03K 17/30* (2013.01); *G09G 2300/0408* (2013.01); *G09G 2310/0286* (2013.01)

(56) References Cited

U.S. PATENT DOCUMENTS

| | | | |
|---|---|---|---|
| 10,629,630 B2 * | 4/2020 | Yoshida | G09G 3/36 |
| 2006/0001637 A1 | 1/2006 | Pak et al. | |
| 2011/0102409 A1 * | 5/2011 | Hayakawa | G09G 3/3674 |
| | | | 345/212 |
| 2013/0034199 A1 | 2/2013 | Toyotaka | |
| 2014/0023173 A1 * | 1/2014 | Miyake | G11C 19/28 |
| | | | 377/54 |
| 2014/0145625 A1 | 5/2014 | Yamazaki et al. | |
| 2016/0042806 A1 | 2/2016 | Ogawa et al. | |
| 2019/0139617 A1 * | 5/2019 | Sasaki | G09G 3/3688 |
| 2019/0172843 A1 * | 6/2019 | Yoshida | G09G 3/20 |

FOREIGN PATENT DOCUMENTS

| | | |
|---|---|---|
| JP | 2006-24350 A | 1/2006 |
| JP | 2009-94927 A | 4/2009 |
| JP | 2011-120221 A | 6/2011 |
| JP | 2013-55651 A | 3/2013 |
| JP | 2014-131263 A | 7/2014 |
| WO | WO 2014/141800 A1 | 9/2014 |

* cited by examiner

F I G. 5
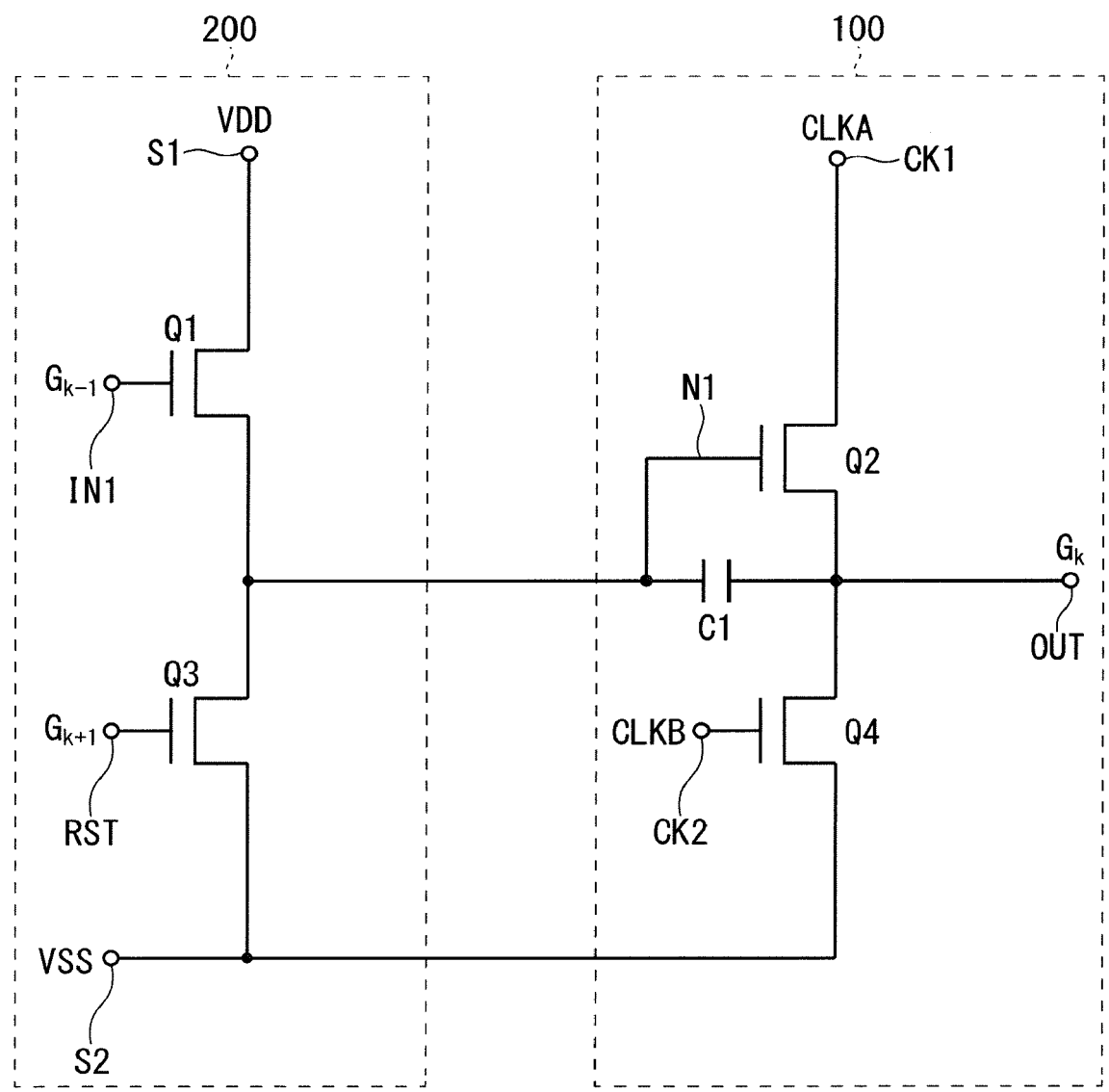

F I G. 7
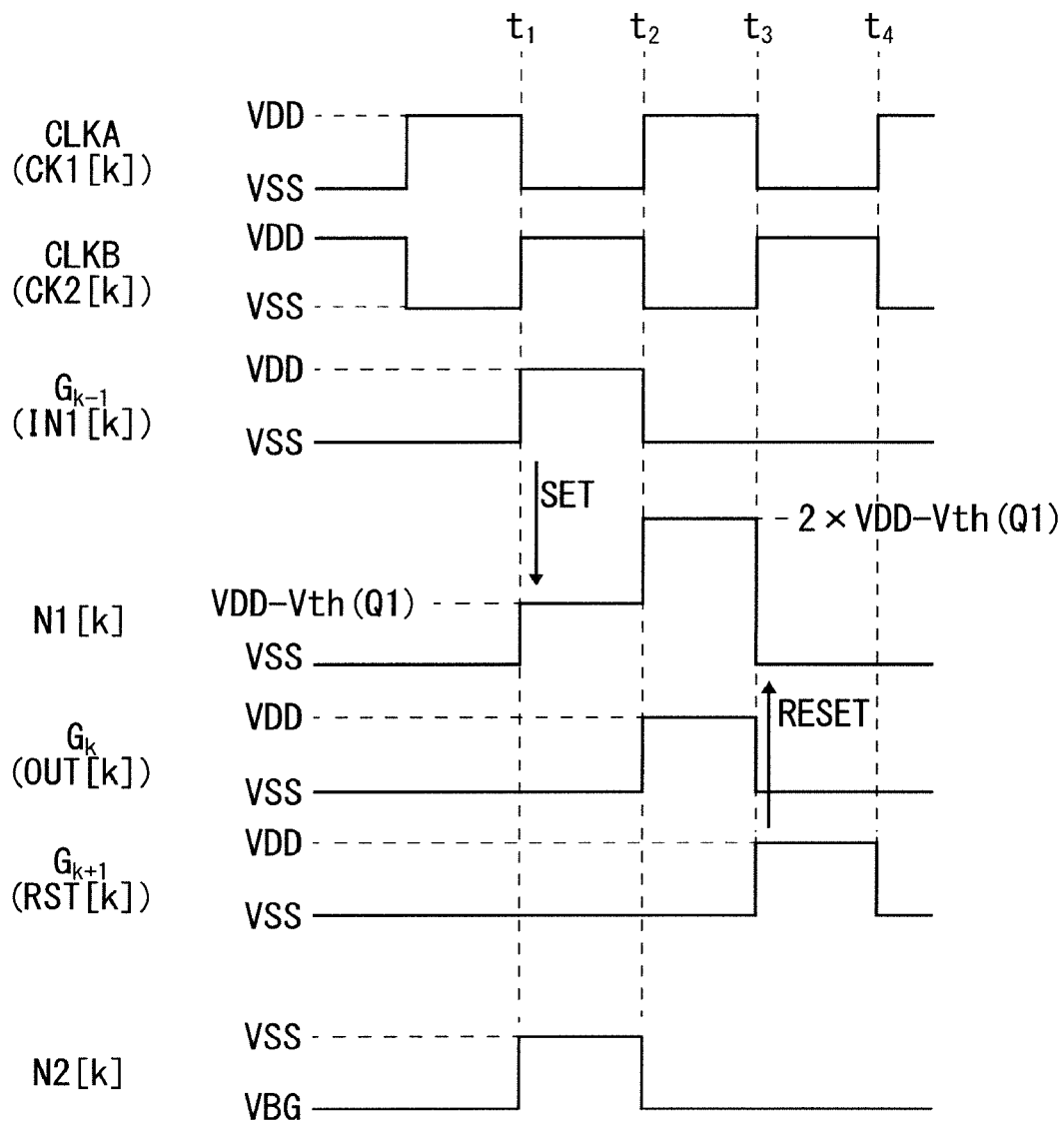

F I G. 1 1
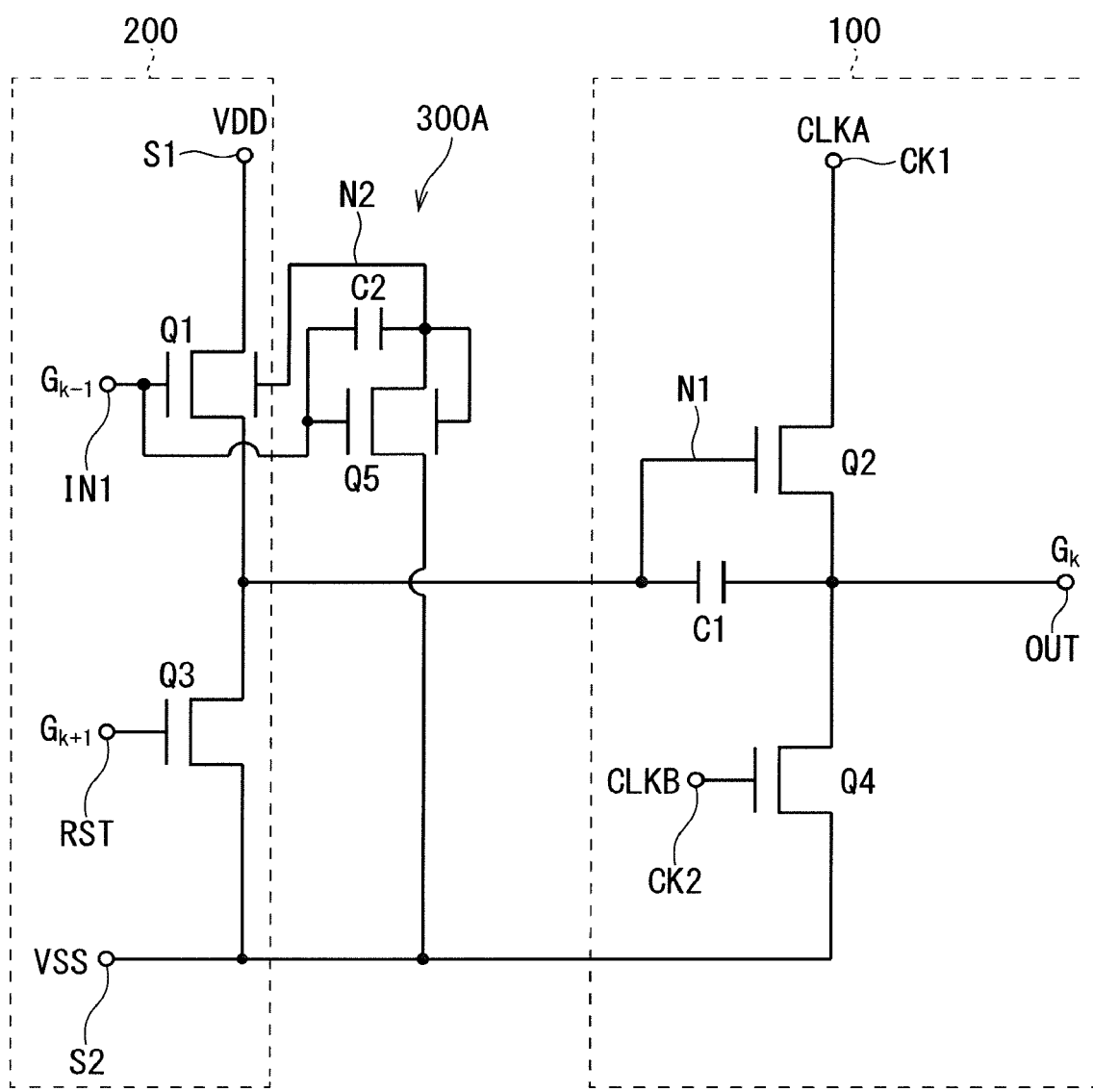

F I G. 1 5
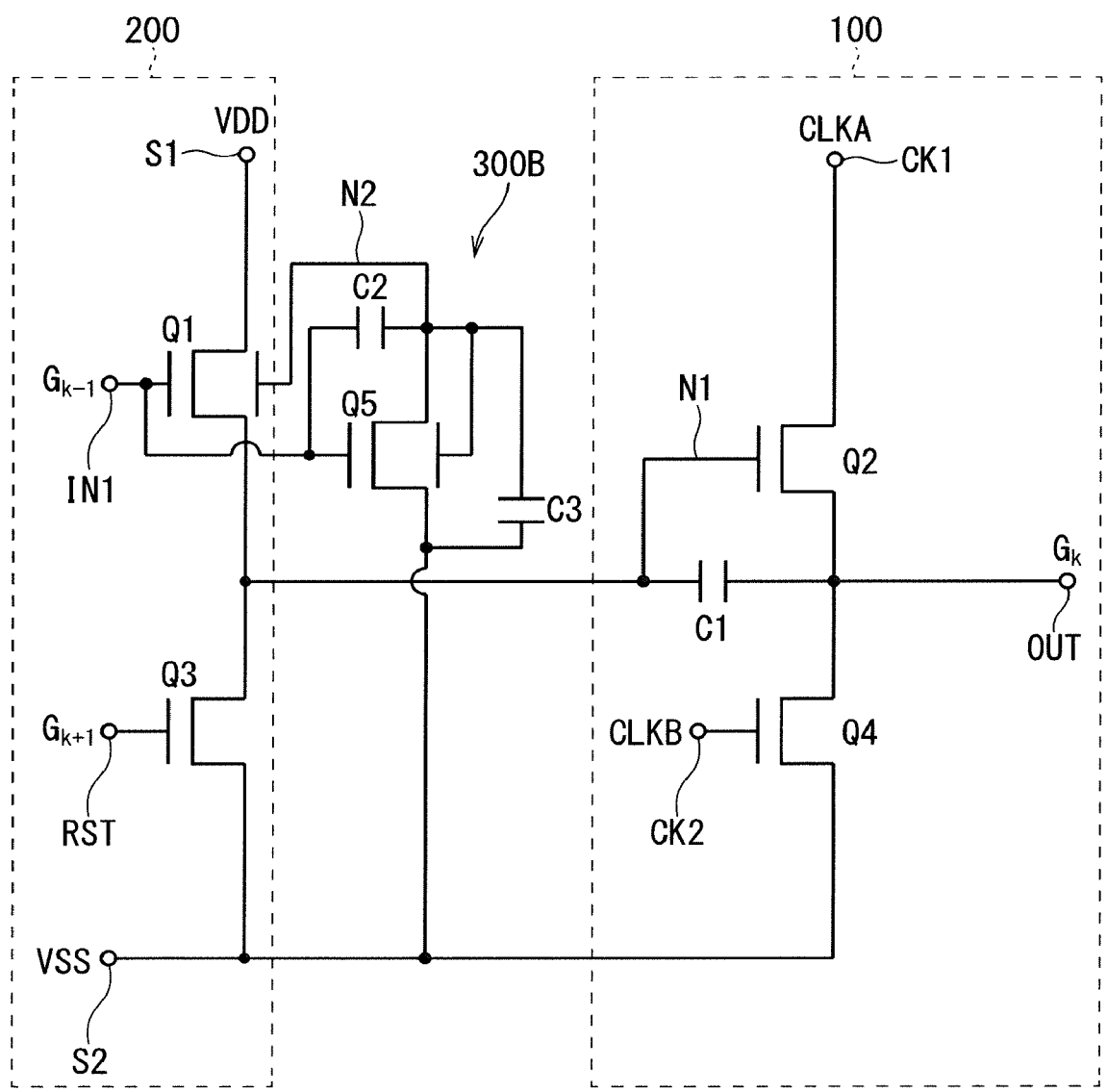

F I G. 2 1
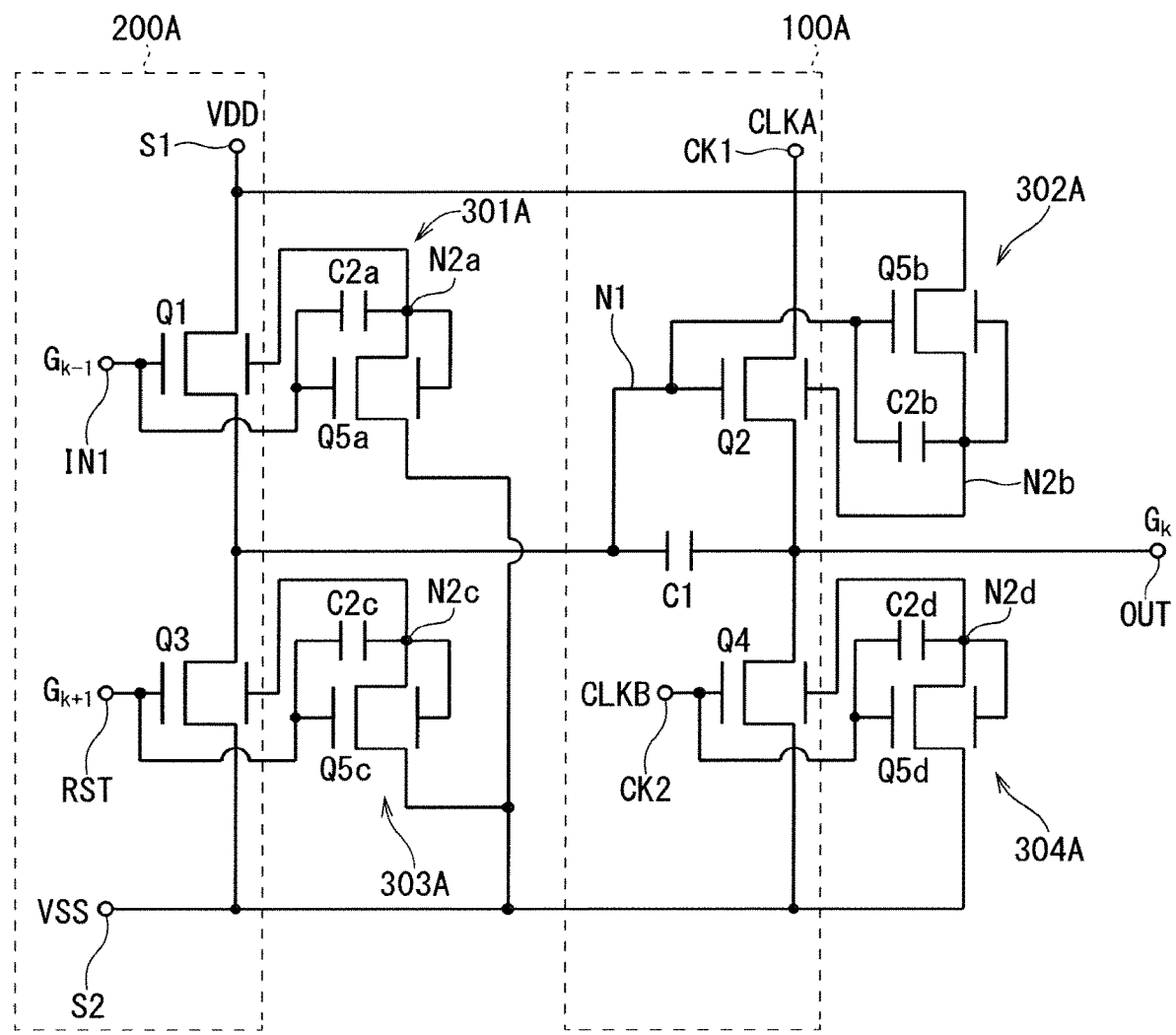

F I G. 2 5
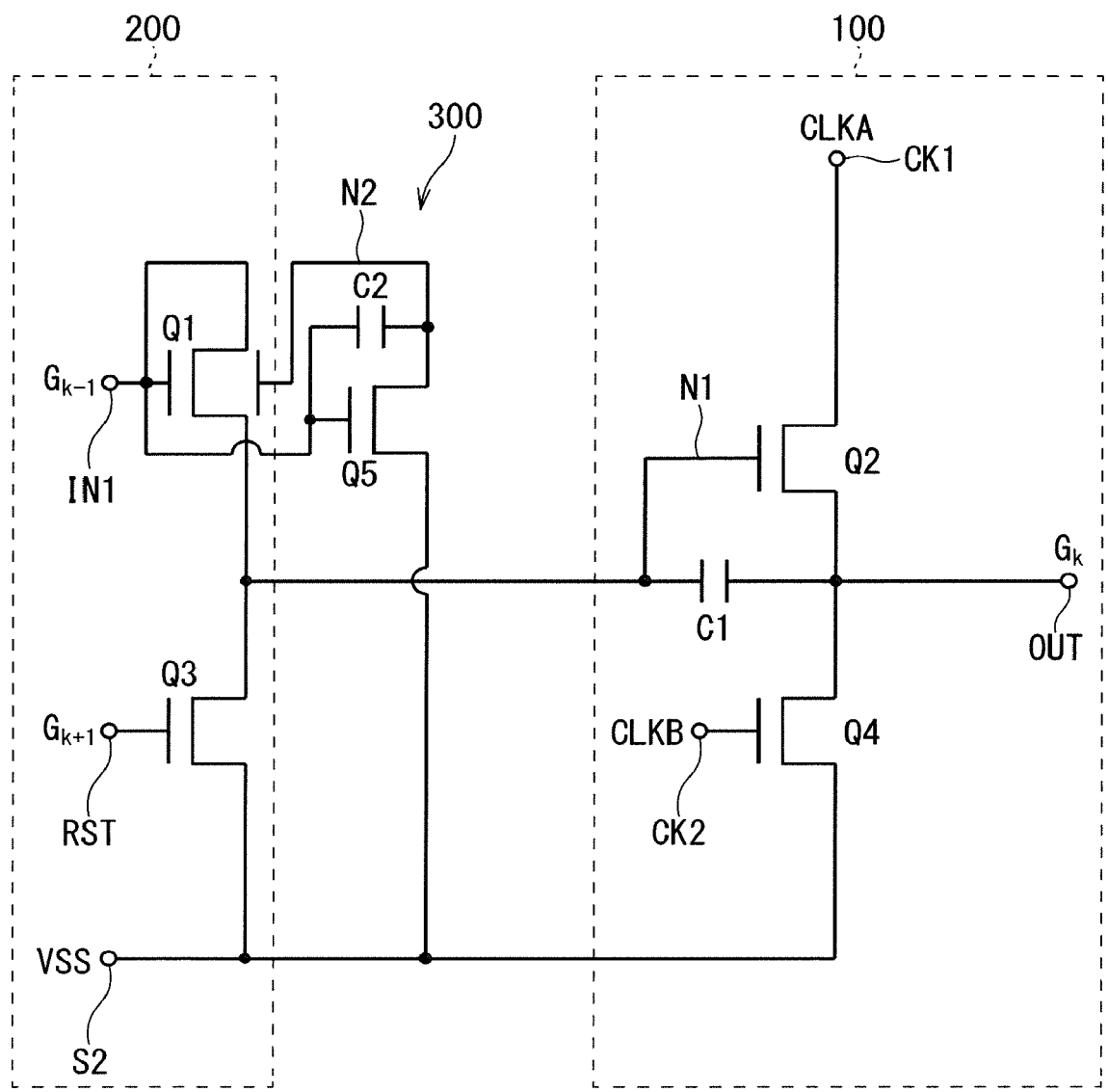

SHIFT REGISTER CIRCUIT AND DISPLAY PANEL

TECHNICAL FIELD

The present invention relates to a shift register circuit and a display panel, and more particularly to a shift register circuit including a plurality of unit shift registers cascade-connected in multistage and a display panel.

BACKGROUND ART

In an image display device such as a liquid crystal display device, it is possible to use a shift register for performing a shift operation that makes a round in one frame period of the display signal as a gate line drive circuit (scanning line drive circuit) for scanning the display panel. In order for the number of steps in the manufacturing process of the display device to decrease, the shift register preferably includes only field effect transistors of the same conductivity type.

The display device in which a shift register of a gate line driver circuit is constituted with a thin film transistor (hereinafter referred to as "TFT") whose channel region is formed of an amorphous semiconductor is easily increased in area and has high productivity, and for example, is widely adopted in a screen of a notebook PC or a large screen display device.

However, when a TFT whose channel region is formed of an amorphous semiconductor is used for a unipolar drive circuit, the transistor may become a depletion type (also referred to as normally-on). This is caused by manufacturing variation of the TFT, fluctuation in the threshold voltage, and the like. A transistor becoming a depletion type generates a leakage current from the TFT. This causes a malfunction such as an increase in power consumption and abnormality of the output signal.

Thus, Patent Document 1 discloses a technique of forming a back gate electrode in a TFT constituting a shift register and controlling a threshold voltage of the TFT by applying a negative voltage to the back gate electrode.

PRIOR ART DOCUMENT

Patent Document

Patent Document 1: Japanese Patent Application Laid-Open No. 2011-120221

SUMMARY

Problem to be Solved by the Invention

In the configuration described in Patent Document 1, since a signal source for controlling the voltage of the back gate electrode is required, there has been a problem that the power supply circuit becomes complicated, resulting in an increase in cost. In the configuration described in Patent Document 1, there has also been a problem that since a back gate voltage is commonly input into all the TFTs constituting a shift register, turning on another TFT at a timing of applying a negative voltage to a back gate to control a threshold voltage of a certain TFT increases on-resistance of the TFT.

The present invention has been made to solve the problems as described above, and an object is to provide a shift register circuit that properly controls the back gate voltage of a transistor with a simple configuration and at a low cost, and a display panel.

Means to Solve the Problem

The shift register circuit according to the present invention is a shift register circuit including a plurality of unit shift registers cascade-connected in multistage. Each of the plurality of unit shift registers includes: an output circuit including a control node, the output circuit configured to output an output signal synchronized with clock signals input into clock terminals to an output terminal, a charge and discharge circuit configured to charge and discharge the control node of the output circuit, a first power supply terminal configured to supply a first power supply voltage to the charge and discharge circuit, and at least one back gate voltage generation circuit. The output circuit or the charge and discharge circuit includes at least one transistor including a back gate electrode. The back gate voltage generation circuit includes a back gate node. The back gate node is connected to the back gate electrode of the transistor. The back gate voltage generation circuit changes a voltage of the back gate node according to a voltage of a gate electrode of the transistor. The back gate voltage generation circuit is supplied with a drive voltage from the first power supply terminal.

Effects of the Invention

In the shift register circuit according to the present invention, at least one transistor included in the unit shift register includes a back gate electrode, and the back gate voltage generation circuit changes the voltage of the back gate electrode according to the voltage of the gate electrode of the transistor. This makes it possible to compensate for the shift of the threshold voltage of the transistor in the reverse direction and stably turn on and off the transistor at an appropriate timing. Furthermore, since the back gate voltage generation circuit is driven by using the power supply originally used by the unit shift register, it is unnecessary to add a power supply for the back gate voltage generation circuit. Therefore, it is possible to change the voltage of the back gate electrode of the transistor with a simple structure and at a low cost.

The objects, features, aspects, and advantages of the present invention will become more apparent from the following detailed description and the accompanying drawings.

BRIEF DESCRIPTION OF DRAWINGS

FIG. 5 is a diagram showing a configuration of a unit shift register according to a comparative example.

FIG. 7 is a diagram showing operation timing of a unit shift register according to the first embodiment.

FIG. 10 is a diagram showing the characteristics of the drain-source current when the back gate transistor is normally off and normally on.

FIG. 11 is a diagram showing a configuration of a unit shift register according to a second embodiment.

FIG. 15 is a diagram showing a configuration of a unit shift register according to a third embodiment.

FIG. 21 is a diagram showing a configuration of a unit shift register according to a fifth embodiment.

FIG. 25 is a diagram showing a configuration of a unit shift register according to the sixth embodiment.

DESCRIPTION OF EMBODIMENTS

First Embodiment

Figure 1:
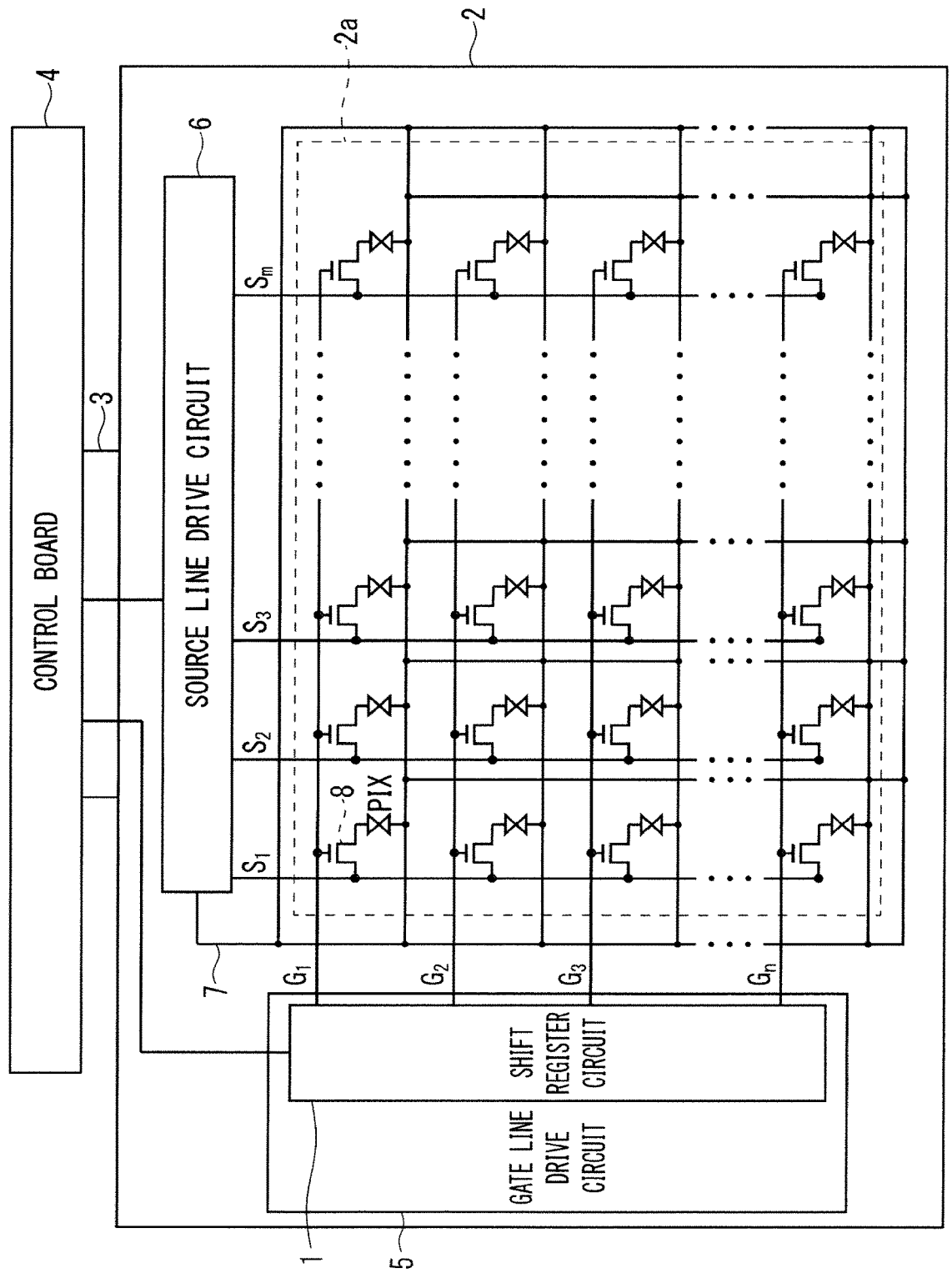
FIG. 1 is a diagram showing a configuration of a liquid crystal display device according to a first embodiment.

FIG. 1 is a diagram showing a configuration of a liquid crystal display device in the first embodiment. As shown in FIG. 1, the liquid crystal display device includes a display panel 2, a flexible printed circuit board 3, and a control board 4.

The display panel 2 is an active matrix display panel. The display panel 2 is an active matrix display panel in which a display region 2a, a plurality of gate lines (scanning signal lines), a plurality of source lines (data signal lines), a gate line drive circuit 5, and a source line drive circuit 6 are built by using amorphous silicon, an oxide semiconductor, or the like on a glass substrate.

In the display region 2a, a plurality of pixels PIX is arranged in a matrix. The pixel PIX includes a TFT 8 being a pixel selection element, a liquid crystal capacitor, and an auxiliary capacitor. The gate of the TFT 8 is connected to a gate line, and the source of the TFT 8 is connected to a source line. The liquid crystal capacitor and the auxiliary capacitor are connected to the drain of the TFT 8.

The gate line drive circuit 5 includes a shift register circuit 1. The shift register circuit 1 outputs output signals $G_1$, $G_2$, ..., $G_n$ to each of a plurality of gate lines. The output signals $G_1$, $G_2$, ..., $G_n$ are gate pulses (scanning pulses).

In addition, the source line drive circuit 6 outputs output signals $S_1$, $S_2$, ..., $S_m$ to each of a plurality of source lines. The output signals $S_1$, $S_2$, ..., $S_m$ are data signals. In addition, each auxiliary capacitor of the pixel PIX is formed with an auxiliary capacitor wiring line 7 for providing an auxiliary capacitor voltage $V_{com}$.

The gate line drive circuit 5 is provided in a region adjacent to one side in an extending direction of gate lines with respect to the display region 2a on the display panel 2. The source line drive circuit 6 is provided in a region adjacent to one side in an extending direction of a plurality of source lines with respect to the display region 2a on the display panel 2.

The gate line drive circuit 5 is monolithically built with the display region 2a on the display panel 2 by using amorphous silicon, an oxide semiconductor, or the like. It should be noted that gate line drive circuits referred to as gate monolithic, gate line drive circuit less, panel built-in gate line drive circuit, gate-in panel, and the like can all be included in the gate line drive circuit 5.

The gate line drive circuit 5 and the source line drive circuit 6 are connected to the control board 4 via the flexible printed circuit board 3. The control board 4 supplies necessary signals and power to the gate line drive circuit 5 and the source line drive circuit 6 via the flexible printed circuit board 3. On the control board 4, the clock signal CLKA and the clock signal CLKB are individually generated from the same clock signal by a level shifter circuit.

Configuration of Shift Register Circuit

Figure 2:
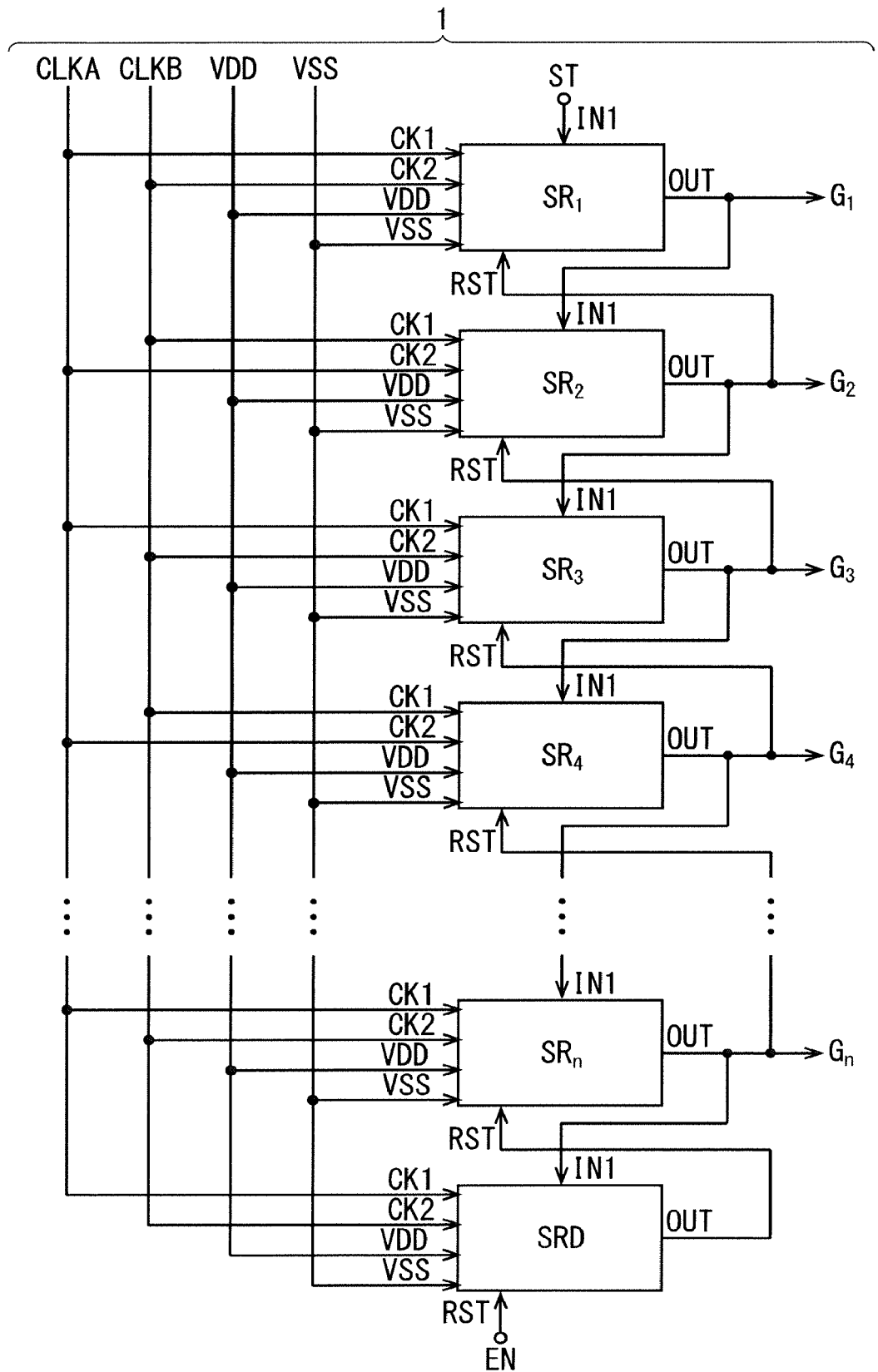
FIG. 2 is a diagram showing a configuration of a shift register circuit according to the first embodiment.

FIG. 2 is a diagram showing a configuration of a shift register circuit 1. As shown in FIG. 2, the shift register circuit 1 includes n unit shift registers $SR_1$, $SR_2$, ..., $SR_n$ cascade-connected in multistage and a dummy unit shift register SRD arranged in the last stage. Since the circuit configurations of the unit shift registers $SR_1$, $SR_2$, ..., $SR_n$ and the dummy unit shift register SRD are the same, these are merely described as the unit shift register SR when not particularly distinguished. In addition, when the shift register of the k-th stage is specified, the shift register is described as a unit shift register $SR_k$. In addition, a shift register of the preceding stage of the unit shift register $SR_k$ (the (k−1)th stage) is described as a unit shift register $SR_{k-1}$. In addition, a shift register of the next stage of the unit shift register $SR_k$ (the (k+1)th stage) is described as a unit shift register $SR_{k+1}$.

Figure 3:
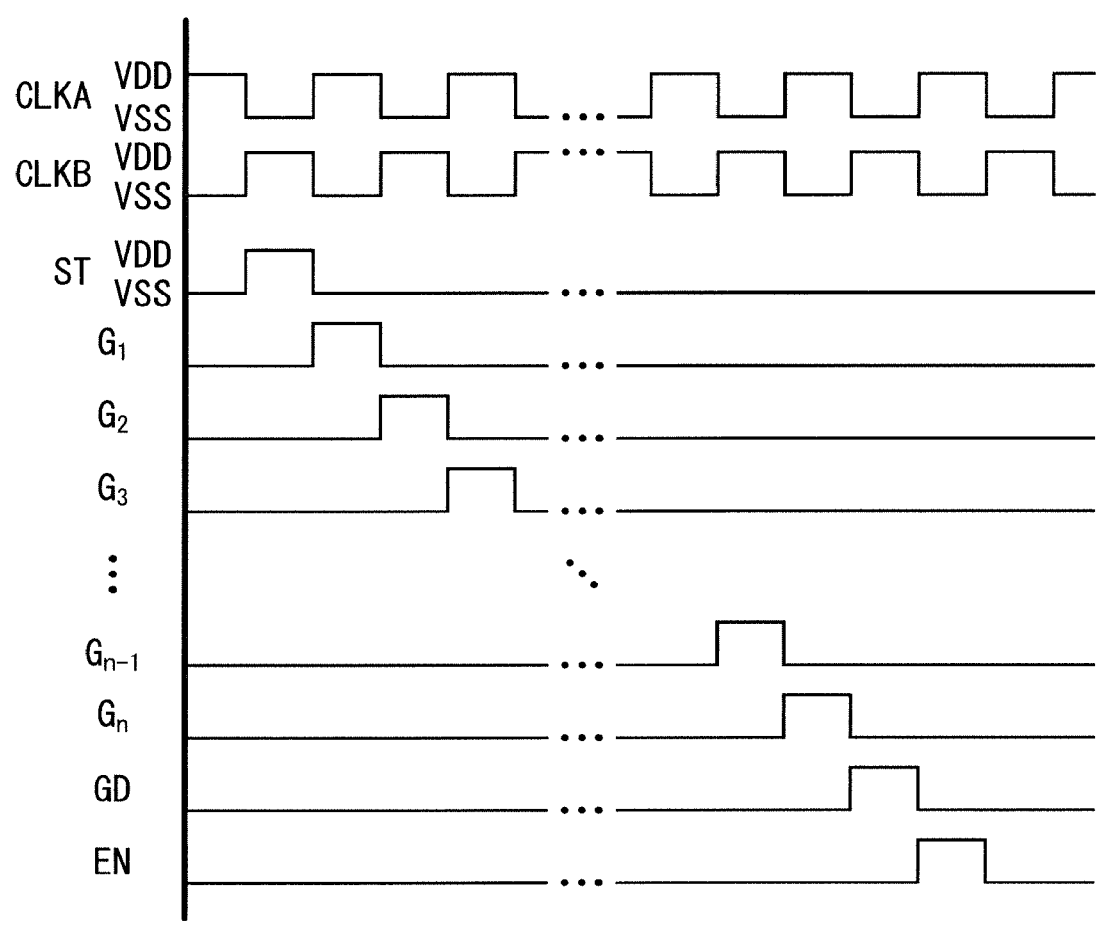
FIG. 3 is a diagram showing operation timing of the shift register circuit according to the first embodiment.

The operation of the shift register circuit 1 shown in FIG. 2 will be described. FIG. 3 is a diagram showing operation timing of the shift register circuit 1.

As shown in FIG. 3, when the start pulse ST is input into the input terminal IN1 of the unit shift register SR1 of the first stage, with this action as a trigger, the output signal G is transmitted to the unit shift registers $SR_1$, $SR_2$, $SR_3$, ..., $SR_n$ in this order while being shifted at the timing synchronized with the clock signals CLKA and CLKB. In the gate line drive circuit 5, the output signals $Gk_1$, $Gk_2$, ..., $Gk_n$ thus output in this order are used as horizontal (or vertical) scanning signals of the display panel.

Hereinafter, the period during which the unit shift register $SR_k$ of the k-th stage outputs a high (H) level output signal $G_k$ is referred to as the "selection period" of the unit shift register $SR_k$. In addition, the period during which the unit shift register $SR_k$ does not output the output signal $G_k$ or the period during which the unit shift register $SR_k$ outputs a low (L) level output signal $G_k$ is referred to as a "non-selection period" of the unit shift register $SR_k$. In addition, the period during which an H level signal is input into the gate electrode in a certain transistor is referred to as a "selection period" of the transistor. In addition, in a certain transistor, the period during which no signal is input into the gate electrode or the period during which an L level signal is input is referred to as a "non-selection period" of the transistor.

It should be noted that the dummy unit shift register SRD is provided to reset the unit shift register $SR_n$ to a reset state with the output signal GD immediately after the unit shift register $SR_n$ of the last stage outputs the output signal $G_n$. For example, in the case of the gate line drive circuit 5, unless the unit shift register $SR_n$ of the last stage is brought into a reset state immediately after the output signal $G_n$ is output, the gate line corresponding thereto (scanning line) may unnecessarily go to the H level, and a display malfunction may occur.

The dummy unit shift register SRD is switched to a reset state by the end pulse EN input into the reset terminal RST at the timing after outputting the output signal GD. When the shift operation of the signal is repeated as in the gate line drive circuit 5, the start pulse ST in the next frame period may be used instead of the end pulse EN.

In addition, when the shift register circuit 1 is synchronized by using two-phase clocks (CLKA and CLKB) as shown in FIG. 2, since each of the plurality of unit shift registers SR is brought to a reset state by the output signal $G_{k+1}$ from the unit shift register $SR_{k+1}$ of the next stage of its own, unless after the unit shift register $SR_{k+1}$ of the next stage operates at least once, normal operation as shown in FIG. 3 cannot be performed. Therefore, prior to the normal operation, it is necessary to perform a dummy operation for transmitting a dummy signal from the first stage to the last stage. Alternatively, a reset transistor may be separately provided between the reset terminal RST of each unit shift register SR and the second power supply terminal S1 (high-potential side power supply), and a reset operation for forcing the back gate node N2 into an H level may be performed before the normal operation. However, in that case, a signal line for resetting is separately required.

Configuration of Unit Shift Register

Figure 4:
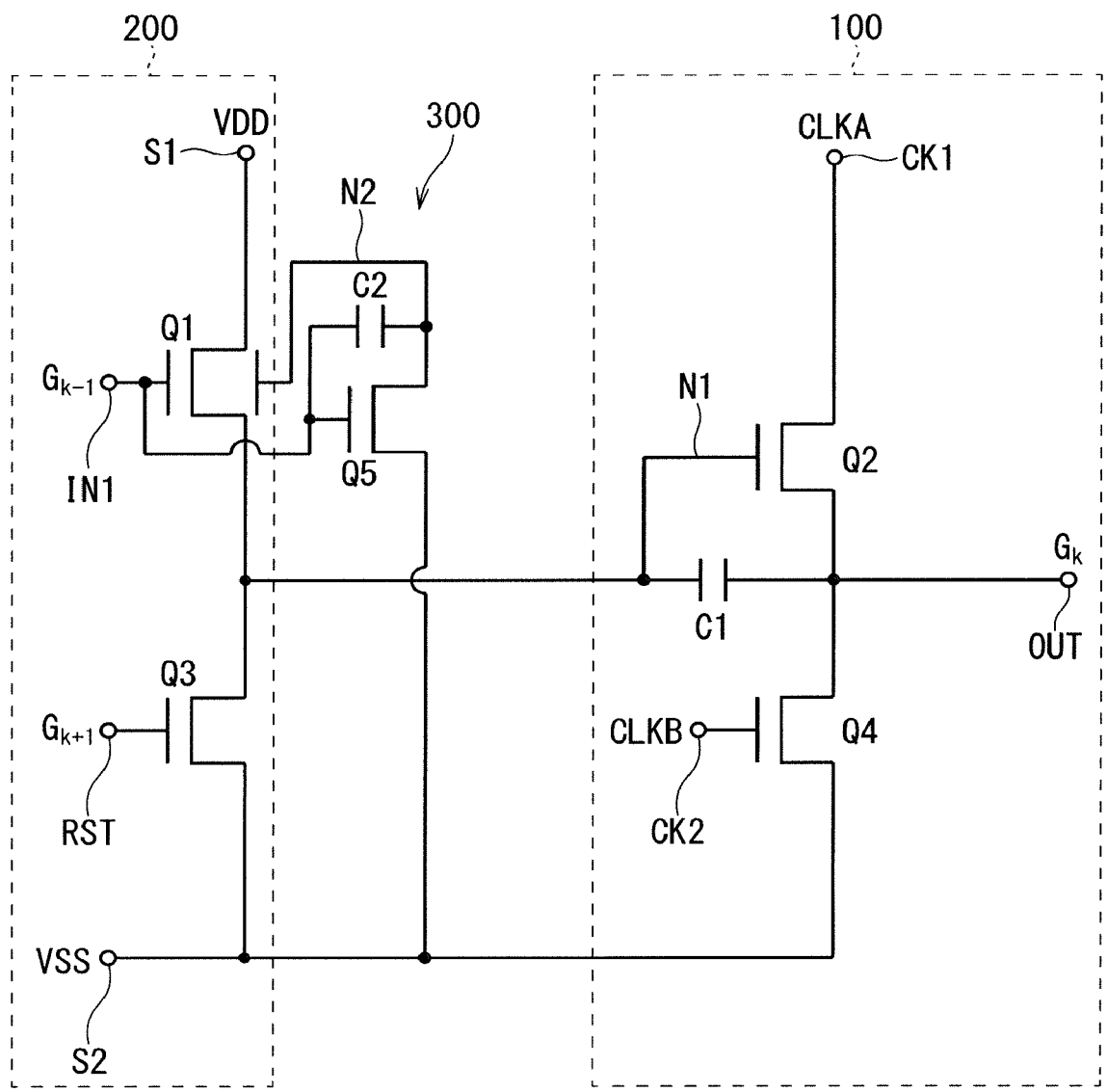
FIG. 4 is a diagram showing a configuration of a unit shift register according to the first embodiment.

FIG. 4 is a diagram showing a configuration of the unit shift register $SR_k$ of the k-th stage. As shown in FIG. 4, the unit shift register $SR_k$ includes an output terminal OUT, clock terminals CK1 and CK2, an input terminal IN1, a reset terminal RST, and first and second power supply terminals S1 and S2.

Clock signals CLKA and CLKB are respectively input into the clock terminals CK1 and CK2 (for example, the unit shift registers SR1, SR3, and the like in FIG. 2 correspond to this). Here, the clock signals CLKA and CLKB are in opposite phases to each other. That is, in a state where the clock signal CLKA is at the high (H) level, the clock signal CLKB is at the L level, and in a state where the clock signal CLKA is at the low (L) level, the clock signal CLKB is at the H level.

The H level potential of the clock signals CLKA and CLKB is VDD (high potential side power supply potential), and the L level potential is VSS (low potential side power supply potential).

As shown in FIGS. 2 and 4, the signal output from the output terminal OUT of the unit shift register $SR_{k-1}$ of the preceding stage is input into the input terminal IN1 of the unit shift register $SR_k$ of the k-th stage. It should be noted that a predetermined start pulse ST is input into the input terminal IN1 of the unit shift register SR1 of the first stage.

In addition, in the unit shift register $SR_k$ of the k-th stage, for example, clock signals CLKA and CLKB are respectively input into the clock terminals CK1 and CK2. In this case, the clock signals CLKB and CLKA are respectively input into the clock terminals CK1 and CK2 of the unit shift register $SR_{k-1}$ and the $SR_{k+1}$ of the preceding stage and the next stage. That is, in adjacent unit shift registers SR, clock signals with phases different from each other are input into the clock terminals.

In addition, the output terminal OUT of the unit shift register $SR_{k+1}$ of the next stage is connected to the reset terminal RST of the unit shift register $SR_k$ of the k-th stage. However, a predetermined end pulse EN is input into the reset terminal RST of the dummy unit shift register SRD provided at the next stage of the unit shift register SRn of the n-th stage.

It should be noted that in the gate line drive circuit 5, the start pulse ST and the end pulse EN are respectively input at timings corresponding to the beginning and the end of each frame period of the image signal.

The second power supply terminal S1 supplies a constant voltage VDD on the high potential side to the charge and discharge circuit 200 and the back gate voltage generation circuit 300 described below. In addition, the first power supply terminal S2 supplies a constant voltage VSS on the low potential side to the charge and discharge circuit 200 and the back gate voltage generation circuit 300 described below. It is assumed that the constant voltage VDD is higher than the constant voltage VSS.

As shown in FIG. 4, the unit shift register $SR_k$ includes an output circuit 100 and a charge and discharge circuit 200. The output circuit 100 includes a control node N1. The output circuit 100 outputs an output signal $G_k$ synchronized with the clock signal CLKA input into the clock terminal CK1 to the output terminal GOUT.

The charge and discharge circuit 200 charges the control node N1 of the output circuit 100 in response to the input terminal IN1 going to the H level. In addition, the charge and discharge circuit 200 discharges the control node N1 of the output circuit 100 in response to the reset terminal RST going to the H level.

As shown in FIG. 4, the output circuit 100 includes second and fourth transistors Q2 and Q4 and a capacitor element C1. The second transistor Q2 is connected between the clock terminal CK1 and the output terminal OUT. That is, the drain electrode of the second transistor Q2 is connected to the clock terminal CK1, and the source electrode thereof is connected to the output terminal OUT. In addition, the gate electrode of the second transistor Q2 is connected to the control node N1.

The fourth transistor Q4 is connected between the output terminal OUT and the first power supply terminal S2. That is, the drain electrode of the fourth transistor Q4 is connected to the output terminal OUT, and the source electrode thereof is connected to the first power supply terminal S2. In addition, the gate electrode of the fourth transistor Q4 is connected to the clock terminal CK2.

One end of the capacitor element C1 is connected to the control node N1 and the other end of the capacitor element C1 is connected to a connection point between the source electrode of the second transistor Q2 and the drain electrode of the fourth transistor. The capacitor element C1 is an element (bootstrap capacitance) that capacitively couples the output terminal OUT and the control node N1 and boosts the control node N1 in accordance with the increase in the level of the output terminal OUT. However, when the capacitance between the gate and the channel of the second transistor Q2 is sufficiently large, the capacitor element C1 can be replaced by the capacitance between the gate and the channel, so the capacitor element C1 may be omitted in such a case.

As shown in FIG. 4, the charge and discharge circuit 200 includes first and third transistors Q1 and Q3. The first transistor Q1 is connected between the second power supply terminal S1 and the control node N1. That is, the drain electrode of the first transistor Q1 is connected to the second power supply terminal S1, and the source electrode thereof is connected to the control node N1. In addition, the gate electrode of the first transistor Q1 is connected to the input terminal IN1. In addition, in the first embodiment, the first transistor Q1 includes a back gate electrode.

The third transistor Q3 is connected between the control node N1 and the first power supply terminal S2. That is, the drain electrode of the third transistor Q3 is connected to the control node N1, and the source electrode thereof is connected to the first power supply terminal S2. In addition, the gate electrode of the third transistor Q3 is connected to the reset terminal RST.

The unit shift register SR in the first embodiment includes a back gate voltage generation circuit 300. The back gate voltage generation circuit 300 includes a back gate node N2, a back gate transistor Q5, and a back gate capacitor element C2. The back gate node N2 is connected to the back gate electrode of the first transistor Q1. That is, the node to which the back gate electrode of the first transistor Q1 is connected is defined as the "back gate node N2".

The back gate voltage generation circuit 300 changes the voltage of the back gate node N2 according to the voltage of the gate electrode of the first transistor Q1. A drive voltage is supplied to the back gate voltage generation circuit 300 from the first power supply terminal S2.

As shown in FIG. 4, the back gate capacitor element C2 is connected between the gate electrode of the back gate transistor Q5 and the drain electrode of the back gate transistor Q5. In addition, of the source electrode or the drain electrode of the back gate transistor Q5, an electrode to which the back gate capacitor element C2 is connected, that is, the drain electrode is connected to the back gate node N2. In addition, the source electrode of the back gate transistor Q5 is connected to the first power supply terminal S2.

In addition, as shown in FIG. 4, the gate electrode of the back gate transistor Q5 is connected to the gate electrode of the first transistor Q1. Thus, the back gate voltage generation circuit 300 increases the voltage of the back gate node N2 while the first transistor Q1 is selected, and decreases the voltage of the back gate node N2 while the first transistor Q1 is not selected.

Operation of Unit Shift Register in Comparative Example

Before describing the operation of the unit shift register SR in the first embodiment, a unit shift register CSR in a comparative example for comparison with the unit shift register SR in the first embodiment will be described. FIG. 5 is a diagram showing a configuration of the unit shift register CSR in the comparative example.

As shown in FIG. 5, the unit shift register CSR in the comparative example has a configuration obtained by removing the back gate voltage generation circuit 300 from the unit shift register SR in the first embodiment. In addition, in the unit shift register CSR in the comparative example, the first transistor Q1 is assumed not to include a back gate electrode. Since the other configurations are the same as those of the unit shift register SR in the first embodiment, a description thereof will be omitted.

Figure 6:
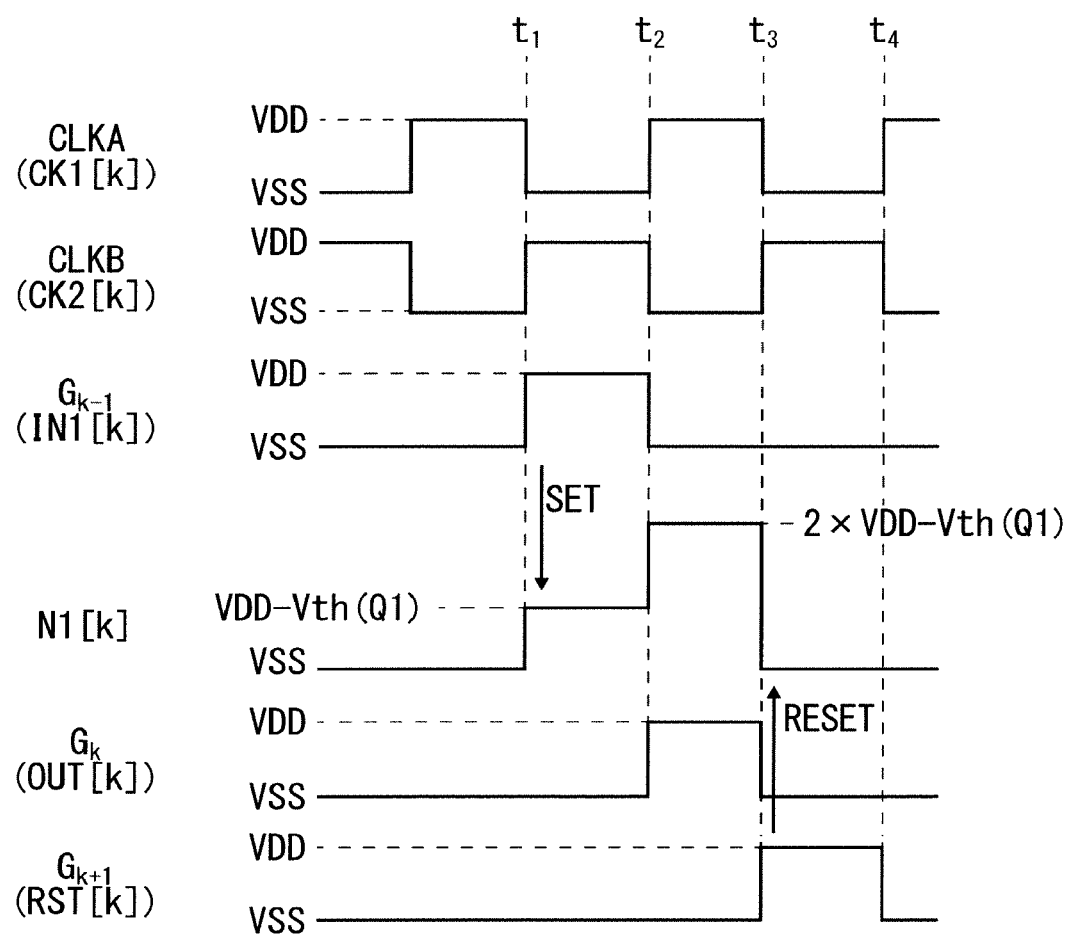
FIG. 6 is a diagram showing operation timing of a unit shift register according to the comparative example.

FIG. 6 is a diagram showing the operation timing of the unit shift register $CSR_k$ of the k-th stage (FIG. 5) in the comparative example. In FIG. 6, "[k]" such as CK1[k], CK2[k], and the like means that the signal is a signal related to the unit shift register $CSR_k$ of the k-th stage.

First, as an initial state of the unit shift register $CSR_k$, it is assumed that the control node N1 is at the L level (hereinafter the state where the control node N1 is at the L level is referred to as the "reset state"). In addition, it is assumed that the input terminal IN1 (the output signal of the preceding stage $G_{k-1}$), the reset terminal RST (the output signal of the next stage $G_{k+1}$), and the clock terminal CK1 (the clock signal CLKA) are all at the L level. In this case, since the second and fourth transistors Q2 and Q4 of the output circuit 100 are both in the off state, the output terminal OUT is in the high impedance state (floating state), but in the initial state, it is assumed that the output terminal OUT (output signal Gk) is also at the L level.

At the time $t_1$, the clock signal CLKA changes from the H level to the L level, the clock signal CLKB changes from the L level to the H level, and the output signal $G_{k-1}$ of the unit shift register $CSR_{k-1}$ of the preceding stage (the start pulse ST when the unit shift register $CSR_k$ is at the first stage) changes to the H level. Then, since the first transistor Q1 of the charge and discharge circuit 200 is turned on and the control node N1 is charged, the control node N1 goes to the H level. A state in which the control node N1 is at the H level is referred to as a "set state". At this time, the potential level of the control node N1 (hereinafter simply referred to as "level") rises to VDD-Vth (Q1), where Vth (Q1) is the threshold voltage of the first transistor Q1. As the level of the control node N1 rises, the second transistor Q2 of the output circuit 100 is turned on.

Then, at the time $t_2$, the clock signal CLKB changes from the H level to the L level, the clock signal CLKA changes from the L level to the H level, and the output signal $G_{k-1}$ of the unit shift register $CSR_{k-1}$ of the preceding stage goes to the L Level. Then, the first transistor Q1 of the charge and discharge circuit 200 is turned off, and the control node N1 goes into the floating state while maintaining the H level. In addition, since the second transistor Q2 of the output circuit 100 is in the ON state, the level of the output terminal OUT rises following the clock signal CLKA.

When the level of the clock terminal CK1 and the level of the output terminal OUT rise at the time $t_2$, the level of the control node N1 is boosted due to the coupling through the capacitor element C1 and the capacitor between the gate and the channel of the second transistor Q2. Since the amount of boost at this time substantially corresponds to the amplitude of the clock signal CLKA (VDD), the control node N1 is boosted up to approximately 2×VDD-Vth (Q1).

As a result, the voltage between the gate (control node N1) and source (output terminal OUT) of the second transistor Q2 is kept high even while the output signal $G_k$ goes to the H level. That is, since the on-resistance of the second transistor Q2 is kept low, the output signal $G_k$ rises to the H level at a high speed following the change of the clock signal CLKA to the H level. In addition, at this time, since the second transistor Q2 operates in the linear region (non-saturation region), the level of the output signal $G_k$ rises to the VDD the same as the amplitude of the clock signal CLKA.

Furthermore, since the on-resistance of the second transistor Q2 is kept low also when the clock signal CLKB changes from the H level to the L level and the clock signal CLKB changes from the L level to the H level at the time $t_3$, the output signal $Q_k$ falls at a high speed following the clock signal CLKA and falls from the H level to the L level.

In addition, at this time $t_3$, since the output signal $G_{k+1}$ of the unit shift register $CSR_{k+1}$ of the next stage input into the reset terminal RST and the clock signal CLKB go to the H level, the third transistor Q3 of the charge and discharge circuit 200 and the fourth transistor Q4 of the output circuit 100 are turned on. Thus, the output terminal OUT is sufficiently discharged via the fourth transistor Q4 and reliably goes to the L level (VSS). In addition, the control node N1 is discharged by the third transistor Q3 to the L level. That is, the unit shift register $CSR_k$ changes from the set state to the reset state.

Then, after the output signal $G_{k+1}$ of the unit shift register $SR_{k+1}$ of the next stage returns to the L level at the time $t_4$, the unit shift register $CSR_k$ is maintained in the reset state until the output signal $G_{k-1}$ of the unit shift register $SR_{k-1}$ of the preceding stage is input into the input terminal IN1. The output signal $G_k$ is kept at the L level.

To summarize the above operation, the unit shift register $CSR_k$ is in a reset state during a period in which the signal (the start pulse SP or the output signal $G_k$ of the unit shift register $CSR_{k-1}$ of the preceding stage) is not input into the input terminal IN1. In the reset state, since the second transistor Q2 of the output circuit 100 maintains the off state, the output signal $G_k$ from the output terminal OUT is maintained at the L level (VSS).

Then, when a signal is input into the input terminal IN1, the unit shift register $CSR_k$ is switched to the set state. Since in the set state, the second transistor Q2 of the output circuit 100 is turned on, the output signal $G_k$ from the output terminal OUT goes to the H level while the signal of the clock terminal CK1 (clock signal CLKA) goes to the H level. Then, thereafter, when the signal (the output signal $G_{k+1}$ of the unit shift register $CSR_{k+1}$ of the next stage or the end pulse EN) is input into the reset terminal RST, the unit shift register $CSR_k$ returns to the reset state.

Here, a problem when the TFT becomes a depletion type (normally on) due to a negative direction shift of the threshold voltage of the transistor will be described.

As can be seen from the timing chart in FIG. 6, the control node N1 of the unit shift register $CSR_k$ of the k-th stage is charged to the H level (VDD-Vth (Q1)) (time $t_1$) when the output signal $G_{k-1}$ of the unit shift register $CSR_{k-1}$ of the preceding stage goes to the H level, and is maintained at the H level in a floating state even when the output signal $G_{k-1}$ of the unit shift register $CSR_{k-1}$ of the previous stage returns to the L level thereafter (time $t_2$). Moreover, while the output signal $G_k$ is at the H level (selection period: time $t_2$ to time $t_3$), the control node N1 is boosted up to the level of 2×VDD-Vth (Q1).

That is, in the first transistor Q1 during the selection period, the drain (first power supply terminal S2) is at the level of VDD, the source (control node N1) is at the level of 2×VDD-Vth (Q1), and the gate (input terminal IN1) is at the level of VSS. That is, the gate is negatively biased with respect to both the source and the drain.

In general, the threshold voltage of a TFT shifts in the negative (minus) direction with time. Therefore, in the unit shift register CSR, a negative shift of the threshold voltage occurs in the first transistor Q1 during the selection period.

In the unit shift register CSR, when the threshold voltage of the first transistor Q1 shifts in the negative direction, a current (leakage current) flows in the first transistor Q1 even when the input terminal IN1 is at the L level, charge is supplied to the control node N1 during the non-selection period, and the level of the control node N1 rises. This may cause a malfunction such that the second transistor Q2 of the unit shift register SR is turned on despite being in the non-selection period, and an output signal G as an erroneous signal is output from the output terminal OUT.

Thus, in the unit shift register SR according to the first embodiment, a back gate electrode is formed in the first transistor Q1 and a voltage lower than VSS is applied to the back gate electrode. Thus, the threshold voltage of the first transistor Q1 is shifted in the positive direction. In other words, during the non-selection period of the first transistor Q1 in which the back gate electrode is formed, applying a voltage lower than VSS to the back gate electrode allows the leak current of the first transistor Q1 to be reduced when the input terminal IN1 is at the L level.

Operation of Unit Shift Register in First Embodiment

FIG. 7 is a diagram showing the operation timing of the unit shift register $SR_k$ (FIG. 4) according to the first embodiment. First, as an initial state of the unit shift register $SR_k$, it is assumed that the control node N1 is at the L level. In addition, it is assumed that the input terminal IN1 (the output signal of the preceding stage $G_{k-1}$), the reset terminal RST (the output signal of the next stage $G_{k+1}$), the clock terminal CK1 (the clock signal CLKA), and the output terminal OUT (output signal $G_k$) are all at the L level.

At the time $t_1$, when the clock signal CLKA changes to the L level, the clock signal CLKB changes to the H level, and the output signal $G_{k-1}$ (the start pulse ST in the case of the first stage) of the unit shift register $SR_{k-1}$ of the preceding stage goes to the H level, both the first transistor Q1 and the back gate transistor Q5 are turned on. Thus, the back gate node N2 goes to the potential VSS the same as the potential of the source electrode of the first transistor Q1. At this time, the back gate capacitor element C2 is charged with the potential difference between the VDD and the VSS.

Then, at the time $t_2$, when the clock signal CLKB changes to the L level, the clock signal CLKA changes to the H level, and the output signal $G_{k-1}$ of the unit shift register $SR_{k-1}$ of the preceding stage goes to the L level, both the first transistor Q1 and the back gate transistor Q5 are turned off. At this time, the level of the back gate node N2 is lowered from the potential VSS to the potential VBG as shown in FIG. 7 due to the discharge of the back gate capacitor element C2. Then, next, the potential VBG is maintained until the output signal $G_{k-1}$ of the unit shift register $SR_{k-1}$ of the preceding stage goes to the H level.

Thus, only during the non-selection period of the first transistor Q1, a negative voltage is applied to the back gate electrode of the first transistor Q1, and during the selection period of the first transistor Q3, the back gate electrode of the first transistor Q1 has the same potential as the VSS. Therefore, it is possible to prevent the negative direction shift of the threshold voltage of the first transistor Q1 and to prevent an increase in the leakage current during the non-selection period of the first transistor Q1. In addition, since the back gate electrode goes to the VSS during the selection period of the first transistor Q1, it is possible to prevent an increase in the on-resistance due to the application of a negative voltage to the back gate electrode during the selection period.

It should be noted that in FIG. 4, the VSS is configured to be input into the source electrode of the back gate transistor Q5, and the output signal $G_{k-1}$ of the unit shift register $SR_{k-1}$ of the preceding stage is configured to be input into the gate electrode, but the present invention is not limited to this configuration. When the rising potential of the signal to be input into the gate electrode is configured to increase with respect to the potential of the source electrode with reference to the potential VSS of the back gate transistor Q5, the potential of the node N2 can be made smaller than the VSS in the non-selection period of the first transistor Q1.

Subsequently, at the time $t_3$, when the clock signal CLKA changes from the H level to the L level and the clock signal CLKB changes from the L level to the H level, the output signal $G_k$ of the unit shift register $SR_k$ returns to the L level. Along with this, since the output signal $G_{k+1}$ of the unit shift register $SR_{k+1}$ of the next stage changes from the L level to the H level, the third and fourth transistors Q3 and Q4 of the unit shift register $SR_k$ are turned on, and the unit shift register $SR_k$ returns to the reset state.

Then, after the output signal $G_{k+1}$ of the unit shift register $SR_{k+1}$ of the next stage returns to the L level at the time $t_4$, the unit shift register $SR_k$ is maintained in the reset state until the output signal $G_{k-1}$ of the unit shift register $SR_{k-1}$ of the preceding stage is input into the input terminal IN1. The output signal $G_k$ is kept at the L level.

As described above, the signal shift operation of the unit shift register SR in the present embodiment is almost the same as that of the comparative example (FIG. 5). A multistage shift register circuit 1 including a plurality of unit shift registers SR operates as described in FIG. 3.

Figure 8:
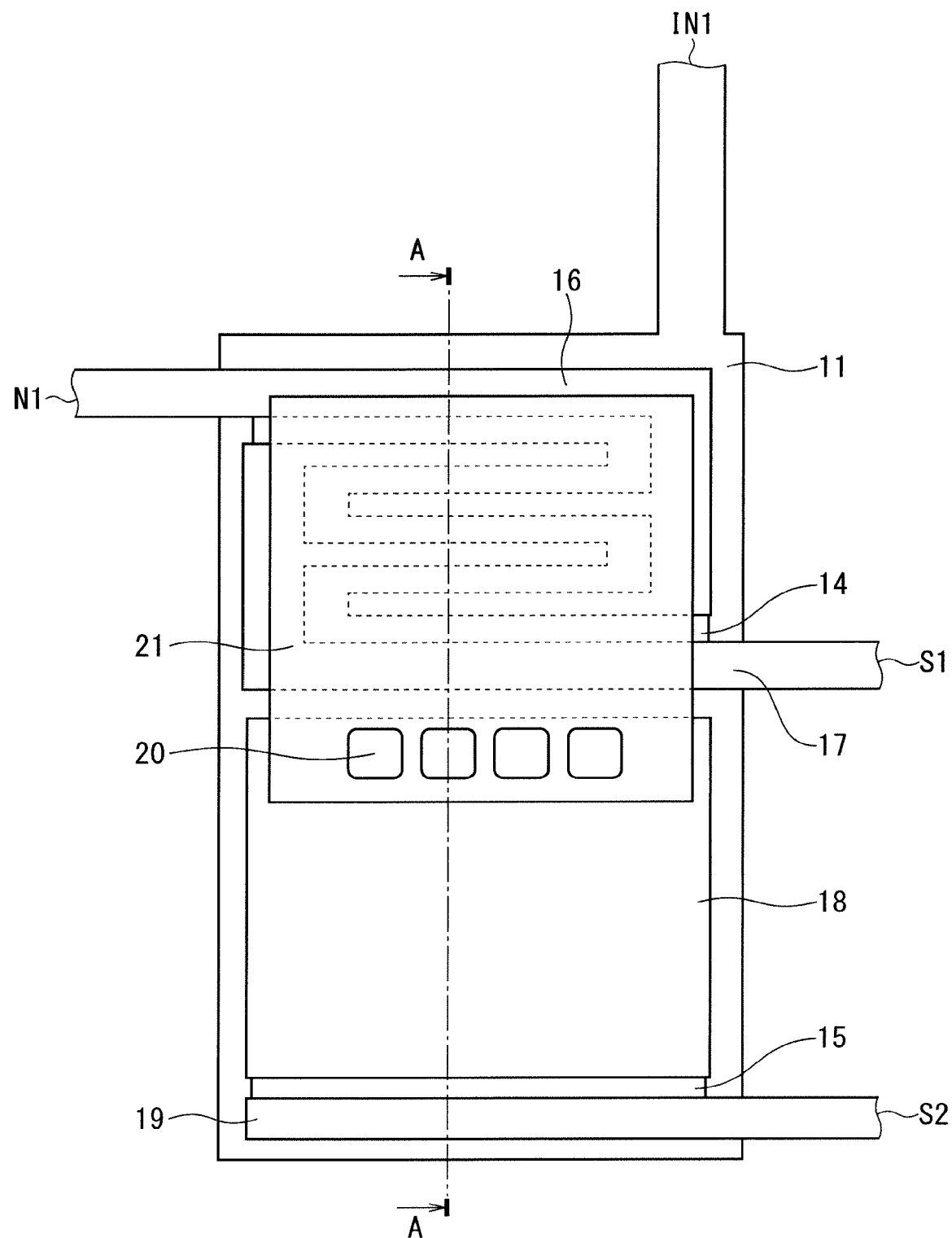
FIG. 8 is a plan view of a first transistor and a back gate voltage generation circuit according to the first embodiment.

FIG. 8 is a plan view of the first transistor Q1 and the back gate voltage generation circuit 300. In addition, FIG. 9 is a cross-sectional view taken along line A-A in FIG. 8.

Figure 9:
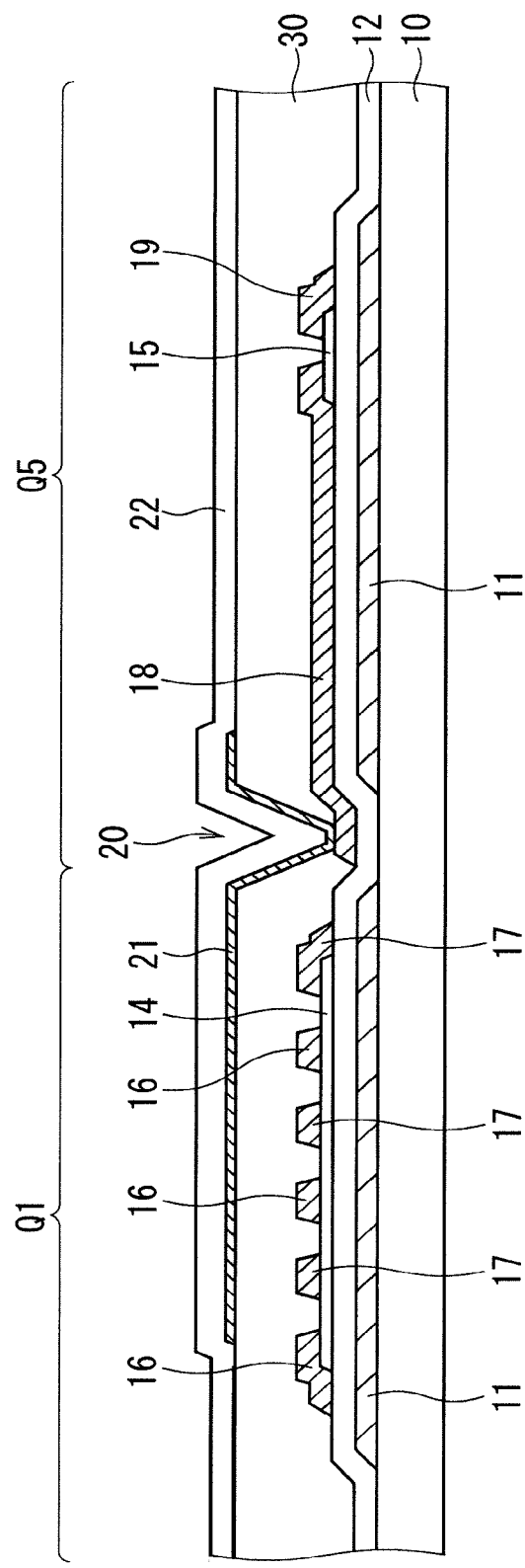
FIG. 9 is a cross-sectional view of the first transistor and the back gate voltage generation circuit according to the first embodiment.

As shown in FIGS. 8 and 9, a gate electrode 11 common to the first transistor Q1 and the back gate transistor Q5 is formed on the glass substrate 10. In addition, liquid crystal is sealed between the glass substrate 10 and the insulating film 22.

The first transistor Q1 and the back gate transistor Q5 are what are called "bottom gate transistors" in which the source electrode and the drain electrode are disposed on the gate electrode 11.

In the first transistor Q1, the semiconductor layer 14, the drain electrode 17, and the source electrode 16 are formed over the gate electrode 11 via the insulating film 12. In addition, in the first transistor Q1, a back gate electrode 21 is formed opposite to the drain electrode 17 and the source electrode 16 via the liquid crystal 30.

In the back gate transistor Q5, the semiconductor layer 15, the drain electrode 18, and the source electrode 19 are formed over the gate electrode 11 via the insulating film 12.

In the contact hole 20, the back gate electrode 21 of the first transistor Q1 and the drain electrode 18 of the back gate transistor Q5 are connected to each other. The back gate electrode 21 corresponds to the back gate node N2. In addition, a back gate capacitor element C2 is formed in a region where the drain electrode 18 and the gate electrode 11 overlap in a plan view.

As shown in FIG. 9, the contact hole 20 is formed in a region with no gate electrode 11. In other words, the gate electrode 11 is hollowed out in a portion overlapping with the contact hole 20 in a plan view. By doing so, a short circuit between the drain electrode 18 and the gate electrode 11 can be prevented even when damage to the drain electrode 18 progresses in the process of forming the contact hole 20.

In addition, the back gate capacitor element C2 is formed between the drain electrode 18 and the gate electrode 11 having a small interelectrode distance. This allows the back gate capacitor element C2 with predetermined electrostatic capacitance to be formed with the minimum area.

In addition, in the first embodiment, an oxide semiconductor is used for the semiconductor layers 14 and 15. It is known that when amorphous silicon is used for a TFT, leakage current due to hole conduction occurs when the gate goes to a negative voltage. On the other hand, since the oxide hardly has any hole, the leakage current can be greatly reduced. Since using an oxide semiconductor for the semiconductor layer 14 can prevent the occurrence of a leakage current due to hole conduction even when a negative voltage is applied to the back gate electrode, it is easier to reduce the power consumption due to the leak current and maintain the negative potential of the back gate node N2.

As described above, in the first embodiment, it is possible to achieve a shift register circuit 1 capable of preventing the malfunction caused by the TFT becoming the depletion type due to the shift phenomenon of the threshold voltage of the TFT.

In addition, in the first embodiment, the transistors included in the output circuit 100, the charge and discharge circuit 200, and the back gate voltage generation circuit 300 (that is, the first to fourth transistors Q1, Q2, Q3, Q4, and the back gate transistor Q5) of each unit shift register SR are assumed to be the field effect transistors having the same conductivity type as the transistors included in each pixel of the display panel 2.

In addition, in the first embodiment, the back gate electrode is formed in the first transistor Q1, and the back gate voltage generation circuit 300 is connected to the first transistor Q1, but the transistor to which the back gate voltage generation circuit 300 is connected is not limited to the first transistor Q1. The back gate voltage generation circuit 300 can be connected to any transistor that becomes the depletion type due to the minus shift of the threshold voltage.

It should be noted that in the first embodiment, the first transistor Q1 includes a back gate electrode and a back gate voltage generation circuit 300 is connected to the back gate electrode of the first transistor Q1, but a transistor to which the back gate voltage generation circuit 300 is connected is not limited to the first transistor Q1. For example, any one of the second to fourth transistors Q2, Q3, and Q4 may include a back gate electrode, and the back gate voltage generation circuit 300 may be connected to the back gate electrode of the transistor.

Effect

The shift register circuit 1 in the first embodiment is a shift register circuit including a plurality of unit shift registers SR cascade-connected in multistage; each of the plurality of unit shift registers SR includes: an output circuit 100, including a control node N1, for outputting an output signal $G_k$ synchronized with the clock signals CLKA and CLKB input into the clock terminals CK1 and CK2 to the output terminal OUT, a charge and discharge circuit 200 for charging and discharging the control node N1 of the output circuit 100, a second power supply terminal S1 for supplying a constant voltage VDD on the high potential side to the charge and discharge circuit 200, a first power supply terminal S2 that supplies a constant voltage VSS on the low potential side to the charge and discharge circuit 200 and has a potential lower than that of the second power supply terminal S1, and at least one back gate voltage generation circuit 300; the output circuit 100 or the charge and discharge circuit 200 includes at least one transistor (first transistor Q1 in the first embodiment) including a back gate electrode; the back gate voltage generation circuit 300 includes a back gate node N2; the back gate node N2 is connected to the back gate electrode of the transistor; the back gate voltage generation circuit 300 changes the voltage of the back gate node N2 according to the voltage of the gate electrode of the transistor; and to the back gate voltage generation circuit 300, a drive voltage is supplied from the first power supply terminal S2 or the second power supply terminal S1.

In the unit shift register SR in the first embodiment, at least one transistor of the unit shift register SR includes a back gate electrode, and the back gate voltage generation circuit 300 changes the voltage of the back gate electrode according to the voltage of the gate electrode of this transistor. This makes it possible to compensate for the shift of the threshold voltage (Vth) of the transistor in the reverse direction and stably turn on and off the transistor at an appropriate timing. Furthermore, in the first embodiment, since the back gate voltage generation circuit 300 is driven by using the power supply originally used by the unit shift register SR, it is unnecessary to add a power supply for the back gate voltage generation circuit 300. Therefore, it is possible to change the voltage of the back gate electrode of the transistor with a simple structure and at a low cost.

In addition, in the unit shift register SR included in the shift register circuit 1 in the first embodiment, the back gate voltage generation circuit 300 increases the voltage of the back gate node N2 while the transistor (first transistor Q1 in the first embodiment) is selected, and lowers the voltage of the back gate node N2 while the transistor is not selected.

In the first embodiment, only during the non-selection period of the first transistor Q1, a negative voltage is applied to the back gate electrode of the first transistor Q1, and during the selection period of the first transistor Q3, the back gate electrode of the first transistor Q1 has the same potential as the VSS. Therefore, it is possible to prevent the negative direction shift of the threshold voltage of the first transistor Q1 and to prevent an increase in the leakage current during the non-selection period of the first transistor Q1. In addition, since the back gate electrode goes to the VSS during the selection period of the first transistor Q1, it is possible to prevent an increase in the on-resistance due to the application of a negative voltage to the back gate electrode during the selection period.

In addition, in the unit shift register SR included in the shift register circuit 1 in the first embodiment; the back gate voltage generation circuit 300 includes a back gate transistor Q5 and a back gate capacitor element C2; the back gate capacitor element C2 is connected between the gate electrode of the back gate transistor Q5 and the source electrode or the drain electrode of the back gate transistor Q5; the electrode to which the back gate capacitor element C2 is connected of the source electrode or the drain electrode of the back gate transistor Q5 is connected to the back gate node N2; and the source electrode or the drain electrode of the back gate transistor Q5 is connected to the first power supply terminal S2 or the second power supply terminal S1.

Therefore, since configuring the back gate voltage generation circuit 300 as described above causes the back gate capacitor element C2 to be charged and discharged in accordance with the turning on and off of the back gate transistor Q5, it is possible to change the voltage of the back gate node N2.

In addition, in the unit shift register SR included in the shift register circuit 1 in the first embodiment, the gate electrode of the back gate transistor Q5 is connected to the gate electrode of the transistor (first transistor Q1 in the first embodiment).

Thus, connecting the gate electrode of the back gate transistor Q5 to a gate electrode of a transistor including a back gate electrode allows the back gate transistor Q5 to be turned on and off at the same timing as that of the turning on and off of the transistor.

In addition, in the unit shift register SR included in the shift register circuit 1 in the first embodiment, the back gate transistor Q5 is a thin film transistor (TFT); the gate electrode 11 of the back gate transistor Q5 is disposed on the substrate (that is, the glass substrate 10); the drain electrode 18 and the source electrode 19 of the back gate transistor Q5 are disposed above the gate electrode 11 via the gate insulating layer (that is, the insulating film 12); and the back gate capacitor element C2 includes a region where the gate electrode 11 and the source electrode 19 or the drain electrode 18 overlap in a plan view.

In the first embodiment, the back gate capacitor element C2 is formed between the drain electrode 18 and the gate electrode 11 having a small interelectrode distance. This allows the back gate capacitor element C2 with predetermined electrostatic capacitance to be formed with the minimum area.

Second Embodiment

In the unit shift register SR in the first embodiment, it is assumed that the first transistor Q1 and the back gate transistor Q5 are normally off in the initial state. On the other hand, in the unit shift register SR in the second embodiment, it is assumed that the back gate transistor Q5 is normally on from the initial state.

Figure 10:
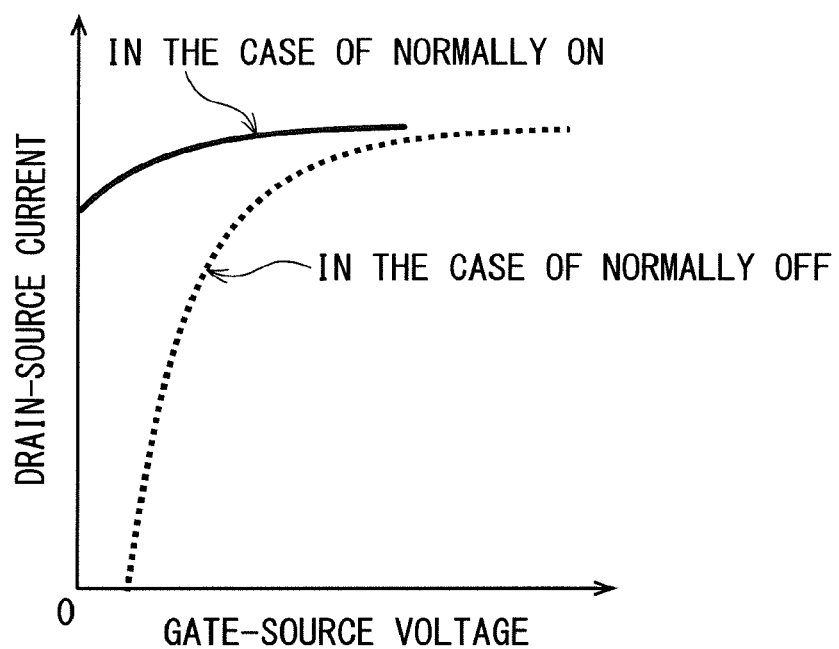

FIG. 10 is a diagram showing the characteristics of the drain-source current when the back gate transistor Q5 is normally off (first embodiment) and normally on (second embodiment). As shown in FIG. 10, when the back gate transistor Q5 is normally off, almost no drain-source current flows when the gate and the source are at the same potential. On the other hand, when the back gate transistor Q5 is normally on, a drain-source current flows even when the gate and the source are at the same potential.

In particular, it is known that, a TFT using an oxide semiconductor, because of deposition conditions and thermal history of an oxide semiconductor, and a short channel with a channel length of 5 μm or less, tends to be normally on. It is assumed that the back gate transistor Q5 in the second embodiment is a TFT using an oxide semiconductor and has a channel length of 4 μm.

In the second embodiment, since the configuration of the liquid crystal display device and the configuration of the shift register circuit 1 are the same as those of the first embodiment (FIGS. 1 and 2), the description thereof will be omitted.

FIG. 11 is a diagram showing the configuration of the unit shift register SR in the second embodiment. As shown in FIG. 11, in the second embodiment, in the back gate voltage generation circuit 300A, the back gate transistor Q5 includes a back gate electrode. The back gate electrode of the back gate transistor Q5 is connected to the back gate node N2. In the second embodiment, the configuration of the unit shift register SR other than the back gate voltage generation circuit 300A is the same as that of the first embodiment (FIG. 4), and the description thereof will be omitted.

Figure 12:
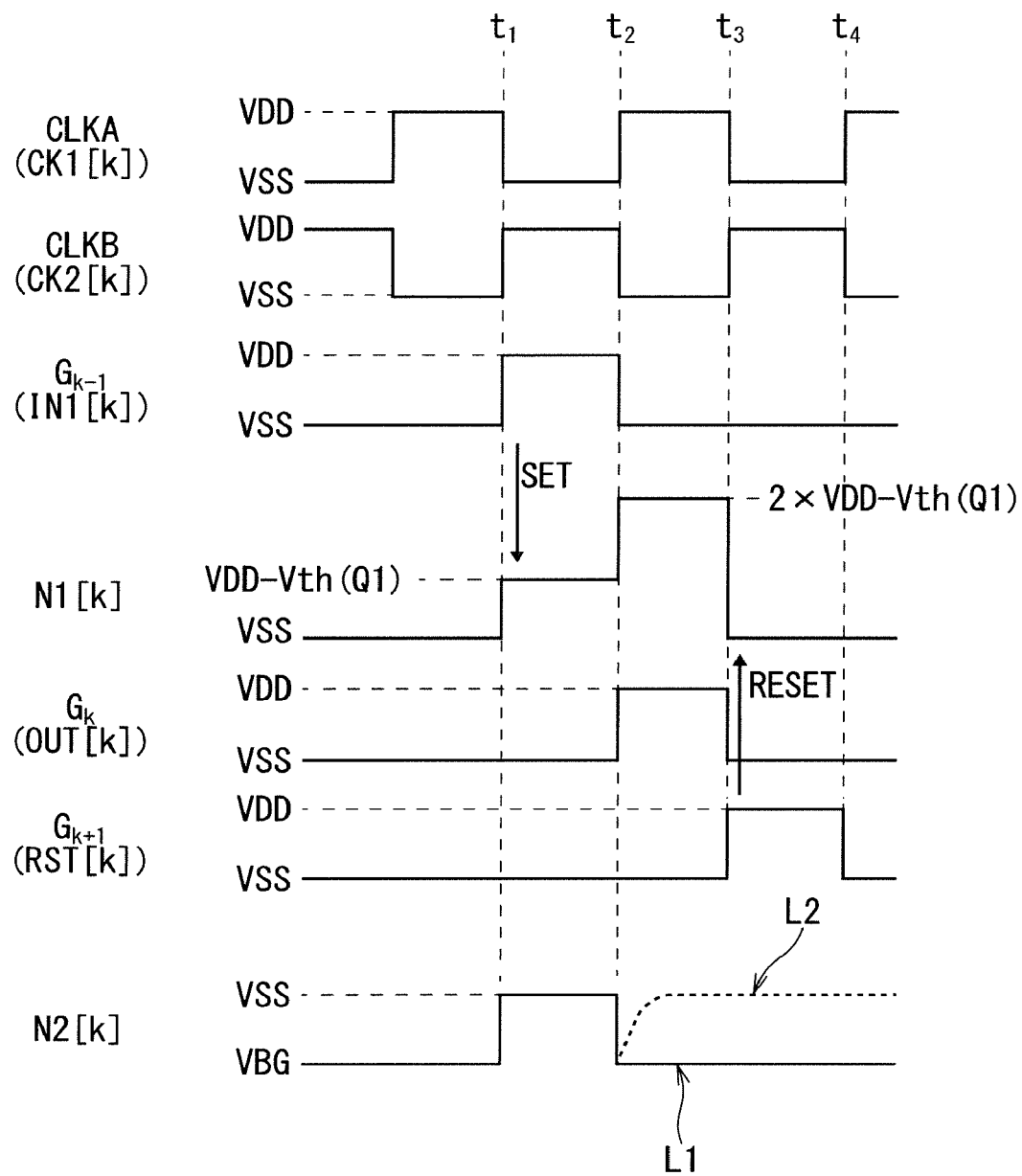
FIG. 12 is a diagram showing operation timing of the unit shift register according to the second embodiment.

FIG. 12 is a diagram showing the operation timing of the unit shift register SR in the second embodiment. At the potential Nc2[k] of the back gate node N2 in FIG. 12, as indicated by the solid line with the arrow L1, in the unit shift register SR in the second embodiment, even when the back gate transistor Q5 is normally on, the voltage of the back gate electrode of the back gate transistor Q5 momentarily goes to a negative voltage at the timing at which the output signal $G_{k-1}$ from the unit shift register $SR_k$ of the preceding stage falls (time $t_2$), so that the back gate transistor Q5 is turned off.

On the other hand, in the unit shift register SR of the first embodiment (FIG. 4), when the back gate transistor Q5 is normally on, the back gate transistor Q5 is not turned off at the timing when the output signal $G_{k-1}$ from the unit shift register $SR_{k-1}$ of the preceding stage falls (time $t_2$). Therefore, at the potential N2[k] of the back gate node N2 in FIG. 12, the back gate node N2 is not maintained at the negative voltage and converges on the VSS potential as indicated by the broken line with the arrow L2.

It should be noted that since the operation timing of the unit shift register SR of the second embodiment is the same as that shown in FIG. 7 described in the first embodiment, the description thereof will be omitted.

Figure 13:
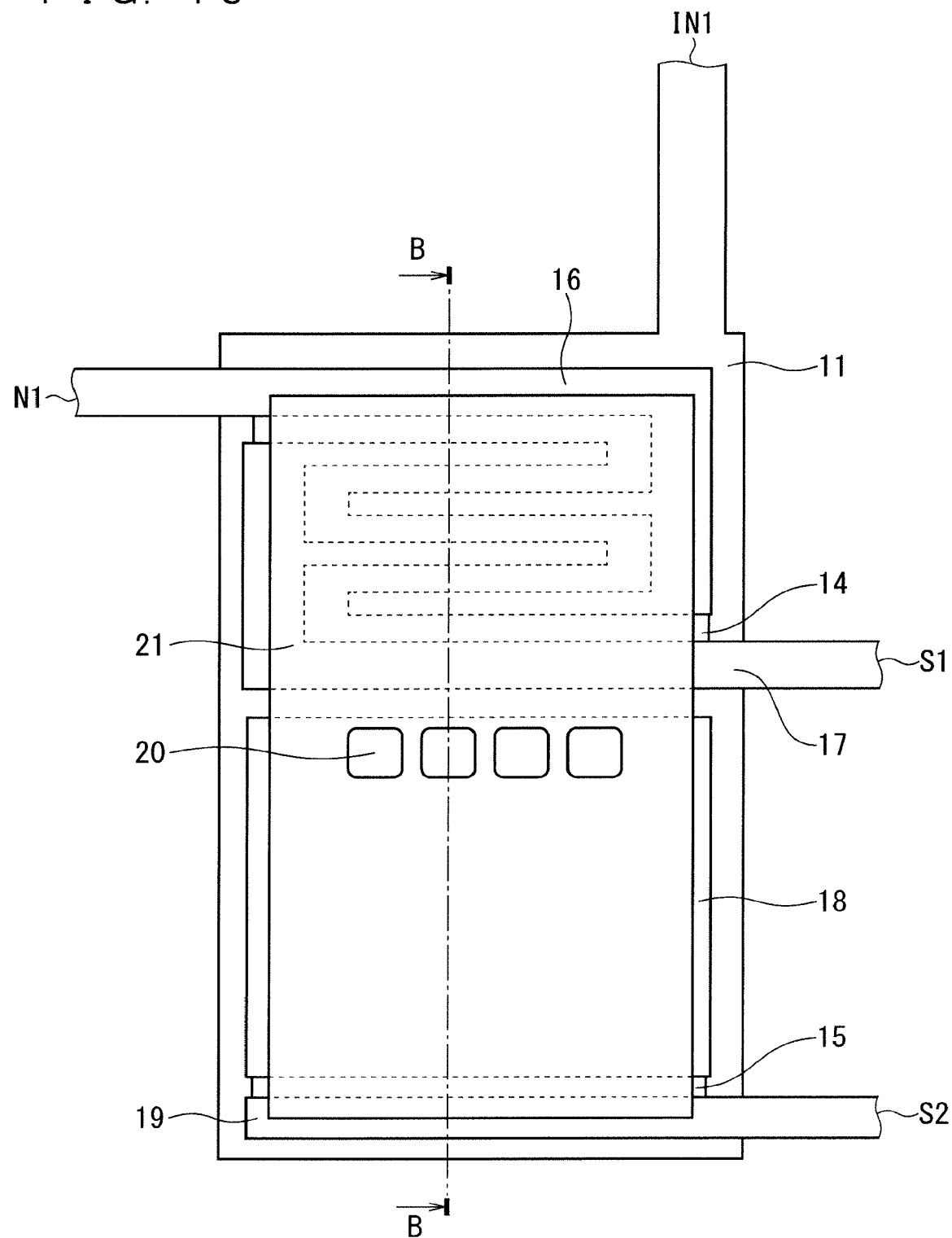
FIG. 13 is a plan view of a first transistor and a back gate voltage generation circuit according to the second embodiment.

Next, the configuration of the first transistor Q1 and the back gate voltage generation circuit 300A included in the charge and discharge circuit 200 of the unit shift register SR of the second embodiment will be described. FIG. 13 is a plan view of the first transistor Q1 and the back gate voltage generation circuit 300A. In addition, FIG. 14 is a cross-sectional view taken along line B-B in FIG. 13.

Figure 14:
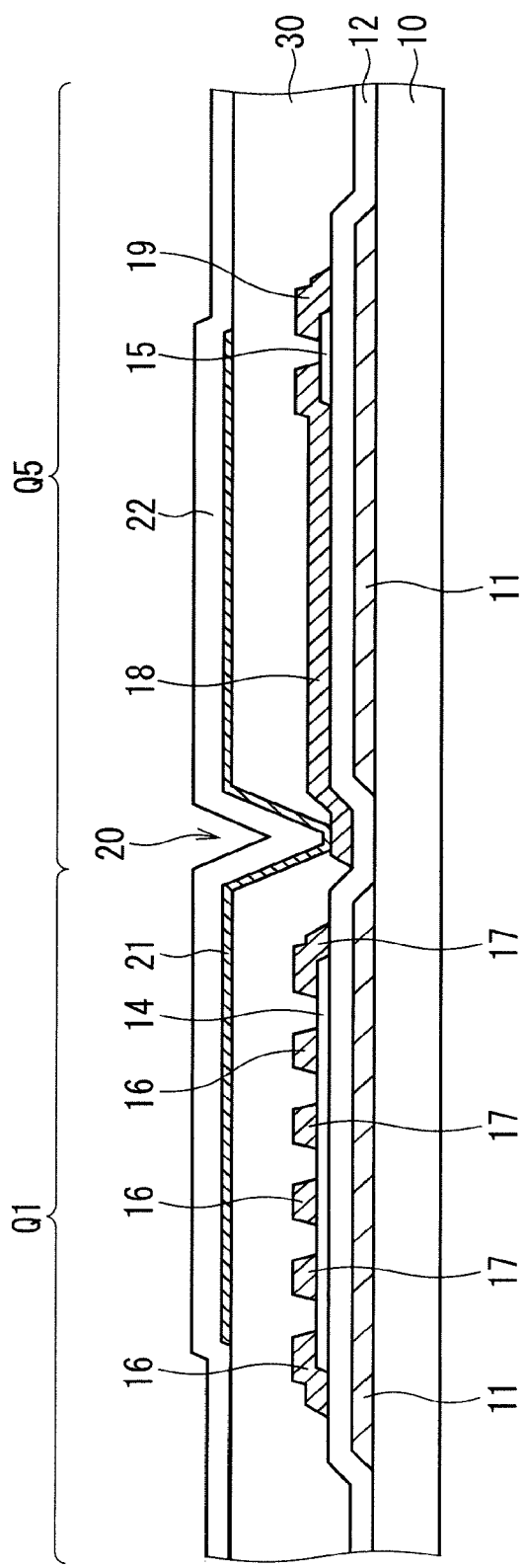
FIG. 14 is a cross-sectional view of the first transistor and the back gate voltage generation circuit according to the second embodiment.

As shown in FIGS. 13 and 14, in the second embodiment, extending the back gate electrode 21 of the first transistor Q1 to just above the semiconductor layer 15 of the back gate transistor Q5 forms a back gate electrode of the back gate transistor Q5. Since the other configurations are the same as those of the first embodiment (FIGS. 8 and 9), the description thereof will be omitted.

Thus, extending the back gate electrode 21 of the first transistor Q1 to just above the semiconductor layer 15 of the back gate transistor Q5 allows the back gate electrode of the back gate transistor Q5 to be formed without increasing the area.

It should be noted that in the second embodiment, the first transistor Q1 includes a back gate electrode and a back gate voltage generation circuit 300A is connected to the back gate electrode of the first transistor Q1, but a transistor to which the back gate voltage generation circuit 300A is connected is not limited to the first transistor Q1. For example, any one of the second to fourth transistors Q2, Q3, and Q4 may include a back gate electrode, and the back gate voltage generation circuit 300A may be connected to the back gate electrode of the transistor.

Effect

In the unit shift register SR included in the shift register circuit 1 in the second embodiment, the back gate transistor Q5 includes a back gate electrode, and the back gate electrode of the back gate transistor Q5 is connected to the back gate node N2.

With this configuration, even when the back gate transistor is normally on, it is possible to stably maintain the negative voltage of the back gate node.

Third Embodiment

FIG. 15 is a diagram showing the configuration of the unit shift register SR in the third embodiment. In the back gate voltage generation circuits 300 and 300A (FIGS. 4 and 11) of the first and second embodiments, the case where the back gate node N2 is connected to only the back gate capacitor element C2 is described. On the other hand, the back gate voltage generation circuit 300B of the third embodiment further includes a voltage dividing capacitor element C3.

As shown in FIG. 15, the voltage dividing capacitor element C3 is connected between the back gate node N2 and the first power supply terminal S2 having the potential VSS. The back gate node N2 is connected between the back gate capacitor element C2 and the voltage dividing capacitor element C3.

In the third embodiment, since the configuration of the liquid crystal display device and the configuration of the shift register circuit 1 are the same as those of the first embodiment (FIGS. 1 and 2), the description thereof will be omitted. In addition, in the third embodiment, the configuration of the unit shift register SR other than the back gate voltage generation circuit 300B is the same as that of the first embodiment (FIG. 4) or the second embodiment (FIG. 11), and the description thereof will be omitted. In addition, since the operation of the unit shift register SR in the third embodiment is the same as that shown in FIG. 7 described in the first embodiment, the description thereof will be omitted.

Configuring the back gate voltage generation circuit 300B as shown in FIG. 15 divides the potential of the back gate node N2 with the back gate capacitor element C2 and the voltage dividing capacitor element C3 as shown in Equation 1. Therefore, a negative potential having a small absolute value as compared with that of the first and second embodiments is applied to the back gate node N2.

[Equation 1]

$$V_{N2} = V_{IN1} \times \frac{C_3}{C_2 + C_3} \tag{1}$$

where, $V_{N2}$ indicates the potential of the back gate node N2. $V_{IN1}$ indicates a potential difference between the input terminal IN1 and the first power supply terminal S2. In addition, $C_2$ and $C_3$ indicate the electrostatic capacitance of the back gate capacitor element C2 and the voltage dividing capacitor element C3.

In the TFT, if a negative voltage continues to be applied to the back gate electrode, the threshold voltage may shift in the negative direction. In the third embodiment, since the negative voltage divided by the voltage dividing capacitor element C3 is applied to the back gate electrode of the first transistor Q1, it is possible to prevent the shift of the threshold voltage of the TFT in the negative direction.

Figure 16:
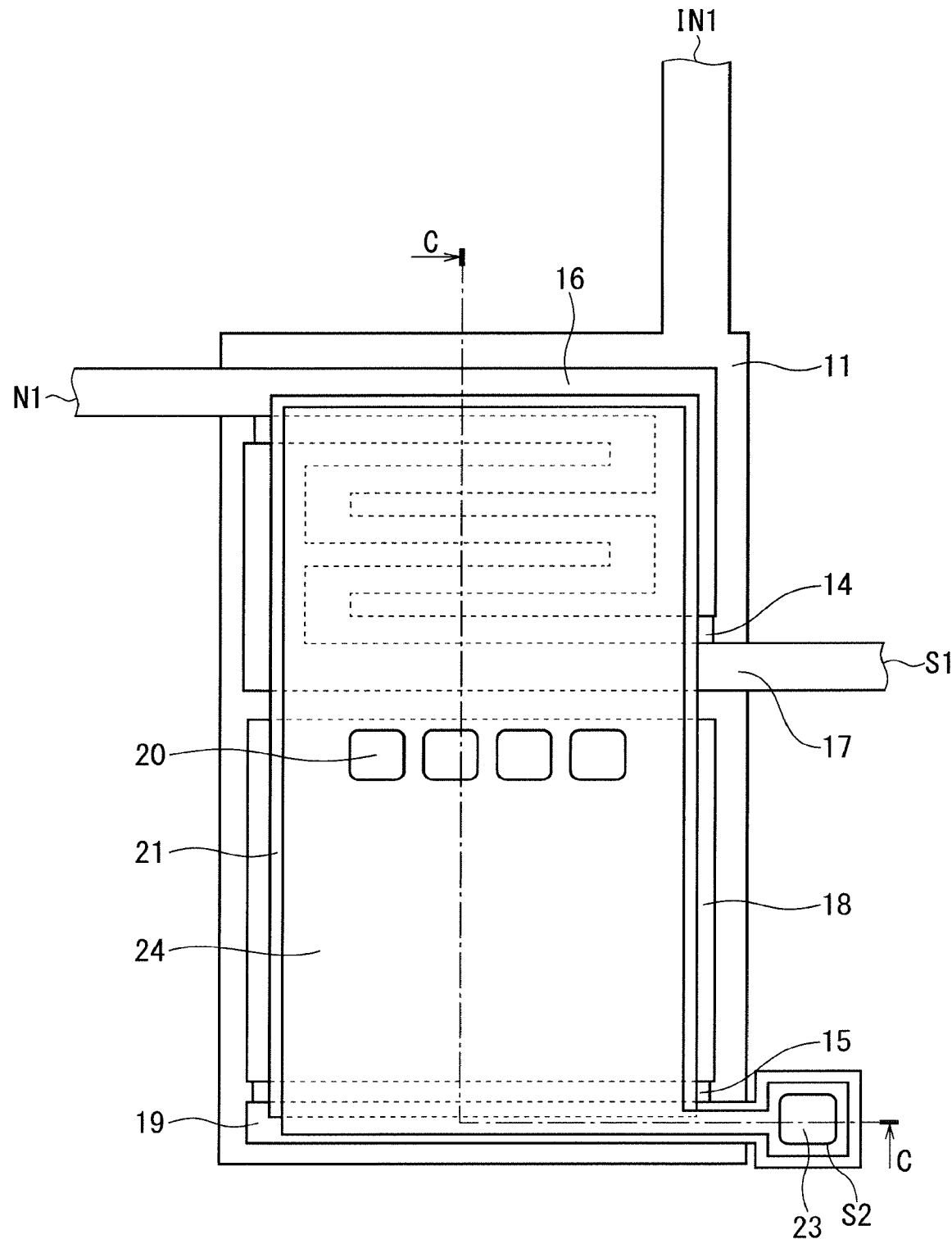
FIG. 16 is a plan view of a first transistor and a back gate voltage generation circuit according to the third embodiment.

Next, the configuration of the first transistor Q1 and the back gate voltage generation circuit 300B included in the charge and discharge circuit 200 of the unit shift register SR of the third embodiment will be described. FIG. 16 is a plan view of the first transistor Q1 and the back gate voltage generation circuit 300B. In addition, FIG. 17 is a cross-sectional view taken along line C-C in FIG. 16.

Figure 17:
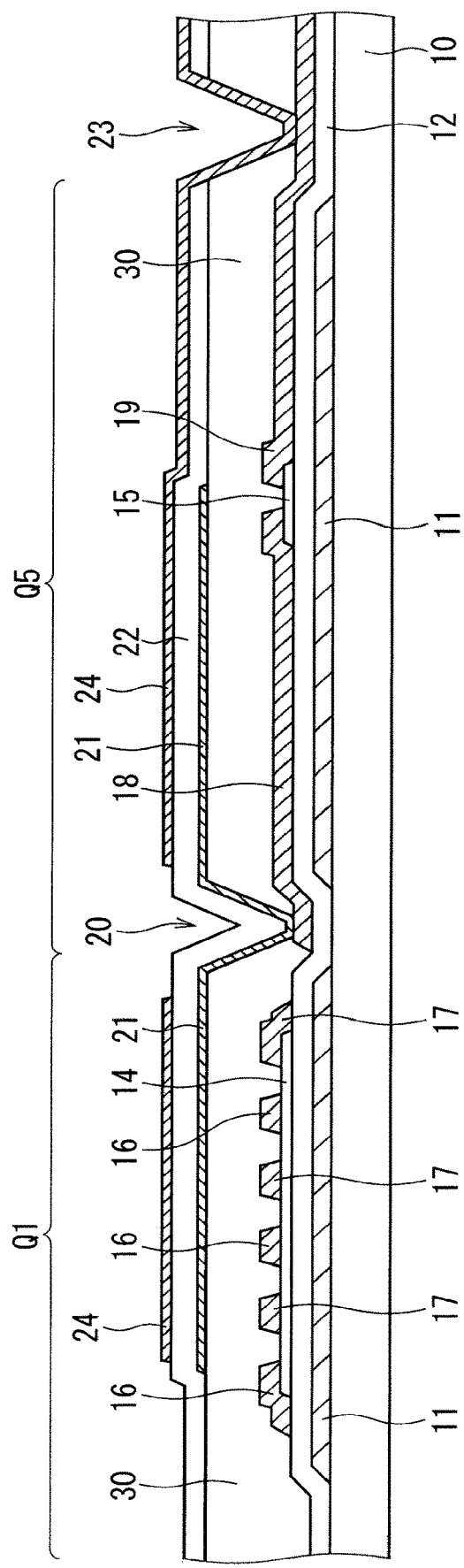
FIG. 17 is a cross-sectional view of the first transistor and the back gate voltage generation circuit according to the third embodiment.

As shown in FIGS. 16 and 17, in the third embodiment, an uppermost layer electrode 24 is further formed over the back gate electrode 21 via an insulating film 22 with respect to the second embodiment (FIGS. 13 and 14). The uppermost layer electrode 24 is formed in a region overlapping with the back gate electrode 21 in a plan view.

The uppermost layer electrode 24 is connected to the source electrode 19 of the back gate transistor Q5 via the contact hole 23. The voltage dividing capacitor element C3 is formed between the back gate electrode 21 and the uppermost layer electrode 24. Since the other configurations are the same as those of the second embodiment (FIGS. 13 and 14), the description thereof will be omitted.

Thus, since the uppermost layer electrode 24 is formed in a region overlapping with the back gate electrode 21 in a plan view, it is possible not to increase the area of the TFT even when the uppermost layer electrode 24 is added.

Thus, forming the uppermost layer electrode 24 in a region overlapping with the back gate electrode 21 in a plan view allows the voltage dividing capacitor element C3 to be formed without increasing the area.

Effect

In the unit shift register SR included in the shift register circuit 1 in the third embodiment, the back gate voltage generation circuit 300B further includes a voltage dividing capacitor element C3, and the voltage dividing capacitor element C3 is connected between the back gate node N2 and the voltage source.

In the third embodiment, the potential of the back gate node N2 is divided by the back gate capacitor element C2 and the voltage dividing capacitor element C3. Therefore, a negative potential having a small absolute value as compared with that of the first and second embodiments is applied to the back gate node N2. Therefore, it is possible to prevent the shift in the negative direction of the threshold voltage of the transistor whose back gate electrode is connected to the back gate node N2.

In addition, in the unit shift register SR included in the shift register circuit 1 in the third embodiment, the back gate transistor Q5 is a thin film transistor (TFT), and the voltage dividing capacitor element C3 includes a region where the back gate electrode 21, and the uppermost layer electrode 24 disposed in the upper layer of the back gate electrode 21 via the insulating layer 22 overlap in a plan view.

In the third embodiment, forming the uppermost layer electrode 24 in a region overlapping with the back gate electrode 21 in a plan view allows the voltage dividing capacitor element C3 to be formed without increasing the area.

In addition, in the unit shift register SR included in the shift register circuit 1 in the third embodiment, the uppermost layer electrode 24 is connected to the first power supply terminal S2 or the second power supply terminal S1.

In the third embodiment, the uppermost layer electrode 24 is connected to the first power supply terminal S2. Thus, the voltage dividing capacitor element C3 is connected between the back gate node N2 and the first power supply terminal S2.

It should be noted that in the third embodiment, the first transistor Q1 includes a back gate electrode and a back gate voltage generation circuit 300B is connected to the back gate electrode of the first transistor Q1, but a transistor to which the back gate voltage generation circuit 300B is connected is not limited to the first transistor Q1. For example, any one of the second to fourth transistors Q2, Q3, and Q4 may include a back gate electrode, and the back gate voltage generation circuit 300B may be connected to the back gate electrode of the transistor.

Fourth Embodiment

Figure 18:
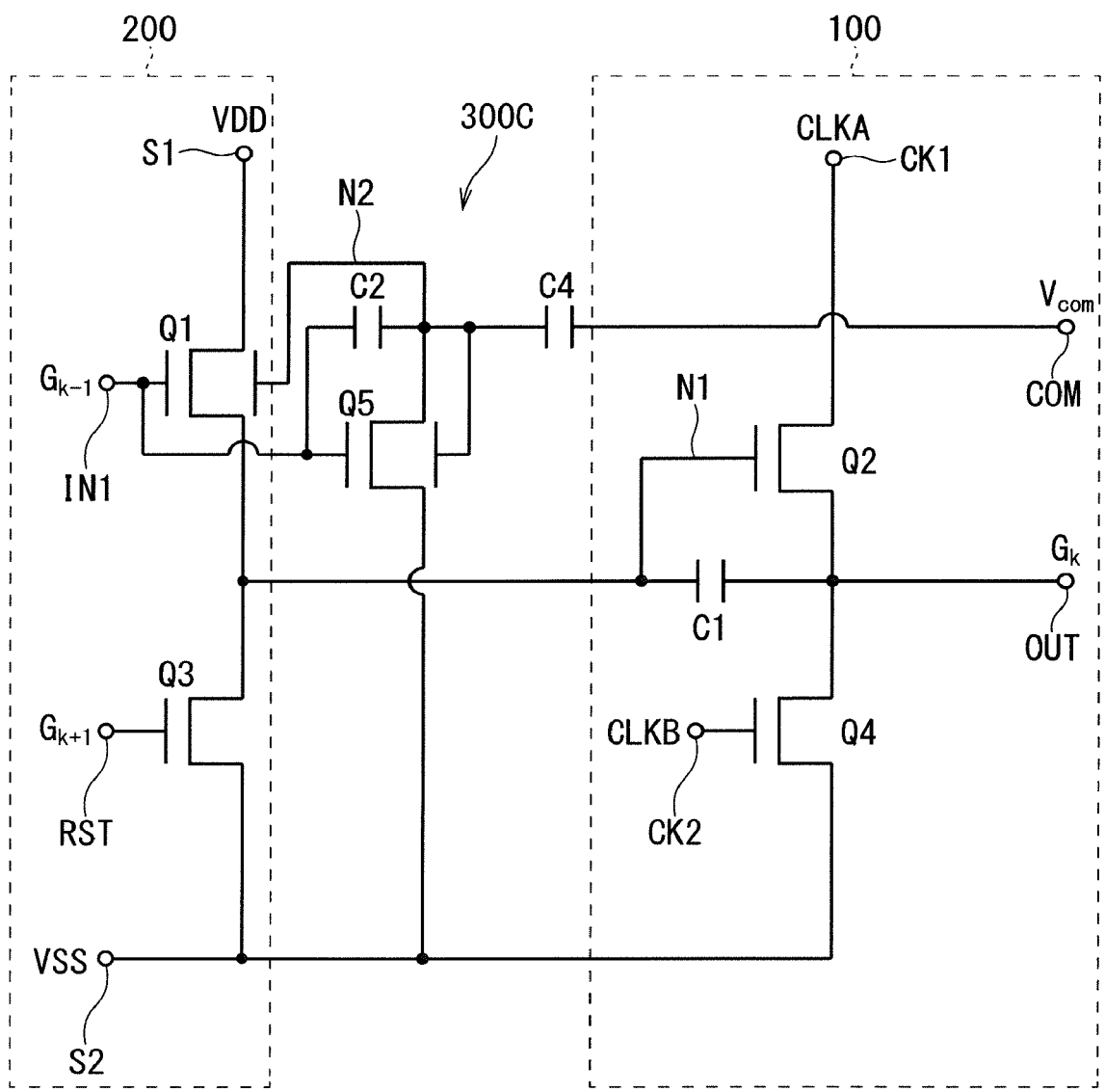
FIG. 18 is a diagram showing a configuration of a unit shift register according to a fourth embodiment.

FIG. 18 is a diagram showing the configuration of the unit shift register SR in the fourth embodiment. The back gate voltage generation circuit 300C in the fourth embodiment includes a voltage dividing capacitor element C4 instead of the voltage dividing capacitor element C3 in the third embodiment (FIG. 15).

In the third embodiment, the voltage dividing capacitor element C3 is connected between the first power supply terminal S2 having the potential VSS and the back gate node N2. On the other hand, in the fourth embodiment, the voltage dividing capacitor element C4 is connected between the auxiliary capacitor wiring line COM and the back gate node N2. An auxiliary capacitor potential $V_{com}$ is supplied to the auxiliary capacitor wiring line COM. The auxiliary capacitor wiring line COM is a wiring line for applying the auxiliary capacitor potential $V_{com}$ to the auxiliary capacitor of each pixel of the display panel.

In the fourth embodiment, since the configuration of the liquid crystal display device and the configuration of the shift register circuit 1 are the same as those of the first embodiment (FIGS. 1 and 2), the description thereof will be omitted. In addition, in the fourth embodiment, the configuration of the unit shift register SR other than the back gate voltage generation circuit 300C is the same as that of the first embodiment (FIG. 4) or the second embodiment (FIG. 11), and the description thereof will be omitted. In addition, since the operation of the unit shift register SR in the fourth embodiment is the same as that shown in FIG. 7 described in the first embodiment, the description thereof will be omitted.

In the fourth embodiment, since the negative voltage divided by the voltage dividing capacitor element C4 is applied to the back gate electrode of the first transistor Q1 as in the third embodiment, it is possible to prevent the shift of the threshold voltage of the TFT in the negative direction.

Figure 19:
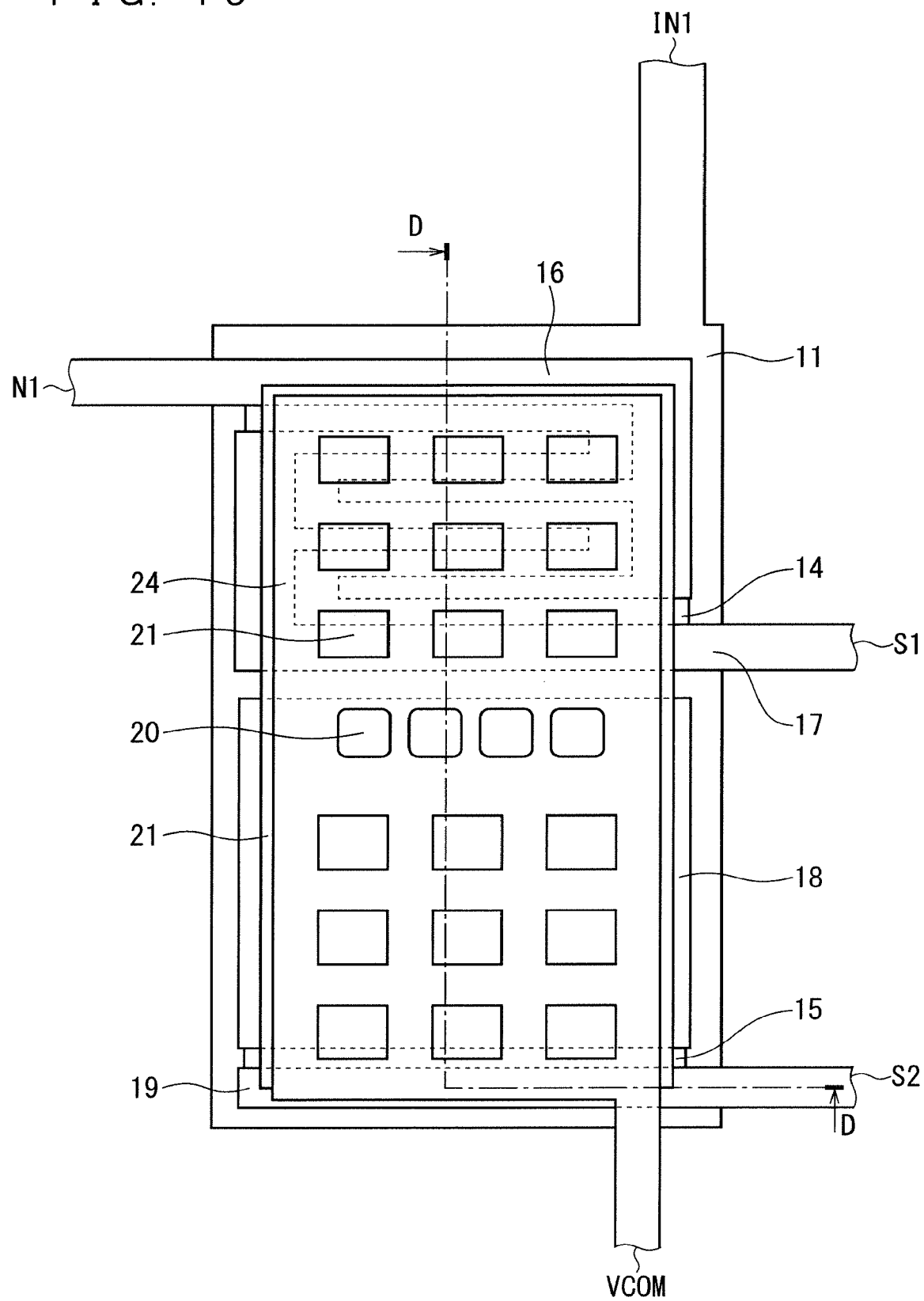
FIG. 19 is a plan view of a first transistor and a back gate voltage generation circuit according to the fourth embodiment.

Next, the configuration of the first transistor Q1 and the back gate voltage generation circuit 300C included in the charge and discharge circuit 200 of the unit shift register SR of the fourth embodiment will be described. FIG. 19 is a plan view of the first transistor Q1 and the back gate voltage generation circuit 300B. In addition, FIG. 20 is a cross-sectional view taken along line D-D in FIG. 19.

Figure 20:
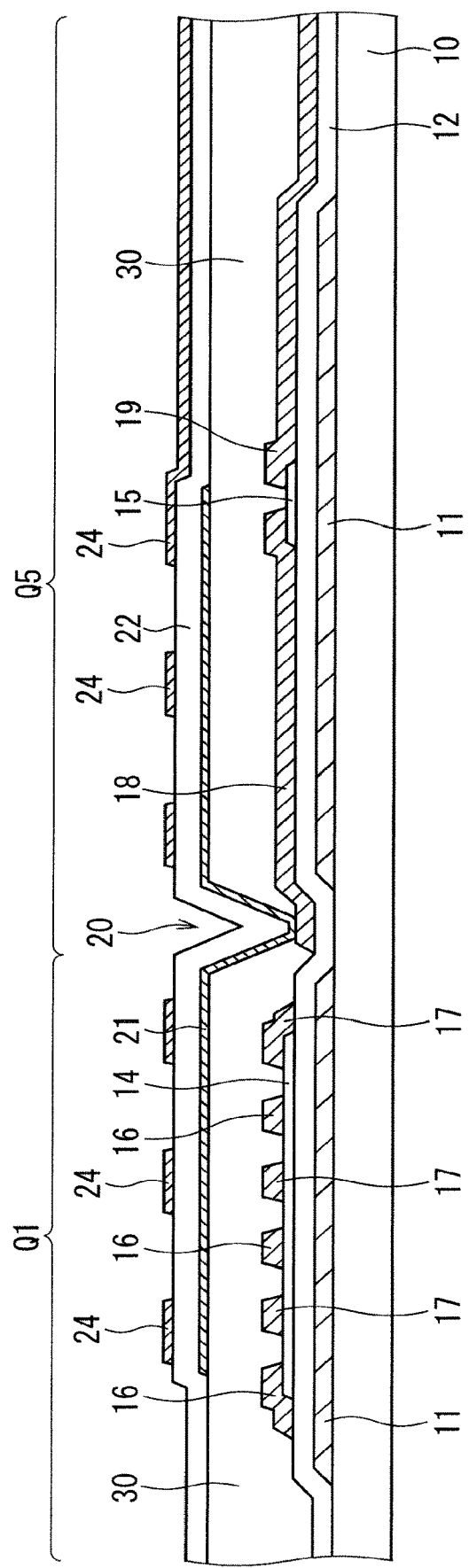
FIG. 20 is a cross-sectional view of the first transistor and the back gate voltage generation circuit according to the fourth embodiment.

As shown in FIGS. 19 and 20, in the fourth embodiment, an uppermost layer electrode 24 is further formed over the back gate electrode 21 via an insulating film 22 with respect to the second embodiment (FIGS. 13 and 14). The uppermost layer electrode 24 is formed in a region overlapping with the back gate electrode 21 in a plan view.

As shown in FIG. 19, the uppermost layer electrode 24 is connected to the auxiliary capacitor wiring line COM. The voltage dividing capacitor element C4 is formed between the back gate electrode 21 and the uppermost layer electrode 24.

As shown in FIGS. 19 and 20, the uppermost layer electrode 24 is formed in a mesh shape. Changing the shape of the mesh allows the electrostatic capacitance of the voltage dividing capacitor element C4 to be adjusted. In the fourth embodiment, for example, the electrostatic capacitance of the voltage dividing capacitor element C4 is set to be half of that of the back gate capacitor element C2.

In addition, in the fourth embodiment, since the uppermost layer electrode 24 is disposed so as to cover the back gate electrode 21, the electric field generated from the back gate electrode 21 can be shielded by the uppermost layer electrode 24. This can prevent display defects that occur when the electric field from the back gate electrode 21 leaks into the display region 2a of the display panel.

Effect

In a plurality of unit shift registers SR included in the shift register circuit 1 in the fourth embodiment, the output terminal OUT is connected to each of a plurality of gate lines included in the display panel, and the uppermost layer electrode 24 is connected to a wiring line to which the auxiliary capacitor potential $V_{com}$ of the liquid crystal panel is applied.

In the fourth embodiment, the potential of the back gate node N2 is divided by the back gate capacitor element C2 and the voltage dividing capacitor element C4. Therefore, a negative potential having a small absolute value as compared with that of the first and second embodiments is applied to the back gate node N2. Therefore, it is possible to prevent the shift in the negative direction of the threshold voltage of the transistor whose back gate electrode is connected to the back gate node N2.

Furthermore, the electric field generated from the back gate electrode 21 can be shielded by the uppermost layer electrode 24. Thus, when the shift register circuit 1 is monolithically built in the display panel using the liquid crystal, it is possible to prevent display defects that occur when the electric field from the back gate electrode 21 leaks into the display region 2a of the display panel.

It should be noted that in the fourth embodiment, the first transistor Q1 includes a back gate electrode and a back gate voltage generation circuit 300C is connected to the back gate electrode of the first transistor Q1, but a transistor to which the back gate voltage generation circuit 300C is connected is not limited to the first transistor Q1. For example, any one of the second to fourth transistors Q2, Q3, and Q4 may include a back gate electrode, and the back gate voltage generation circuit 300C may be connected to the back gate electrode of the transistor.

Fifth Embodiment

Configuration

In the first to fourth embodiments, of the first to fourth transistors, the first transistor Q1 includes a back gate electrode, and any one of the back gate voltage generation circuits 300, 300A, 300B, and 300C is connected to this back gate electrode.

On the other hand, in the fifth embodiment, it is assumed that each of the first to fourth transistors Q1, Q2, Q3, and Q4 includes a back gate electrode, and a back gate voltage is applied to each back gate electrode. FIG. 21 is a diagram showing the configuration of the unit shift register SR in the fifth embodiment.

As shown in FIG. 21, the unit shift register SR in the fifth embodiment includes an output circuit 100A and a charge and discharge circuit 200A. In the output circuit 100A, each of the second and fourth transistors Q2 and Q4 includes a back gate electrode. Since the other configurations of the output circuit 100A are the same as those of the output circuit 100 of the first embodiment (FIG. 4), the description thereof will be omitted. In addition, in the charge and discharge circuit 200A, not only the first transistor Q1 but also the third transistor Q3 includes a back gate electrode. Since the other configurations of the charge and discharge circuit 200A are the same as those of the charge and discharge circuit 200 of the first embodiment (FIG. 4), the description thereof will be omitted.

In addition, the unit shift register SR in the fifth embodiment includes first to fourth back gate voltage generation circuits 301A, 302A, 303A, and 304A.

As shown in FIG. 21, the first back gate voltage generation circuit 301A includes a first back gate node N2a, a first back gate transistor Q5a, and a first back gate capacitor element C2a.

The first back gate node N2a is connected to the back gate electrode of the first transistor Q1. That is, the node to which the back gate electrode of the first transistor Q1 is connected is defined as the "first back gate node N2a".

The first back gate capacitor element C2a is connected between the gate electrode and the drain electrode of the first back gate transistor Q5a. In addition, the drain electrode of the first back gate transistor Q5a is connected to the back gate electrode of the first transistor Q1.

As shown in FIG. 21, the source electrode of the first back gate transistor Q5a is connected to the first power supply terminal S2. The gate electrode of the first back gate transistor Q5a is connected to the gate electrode of the first transistor Q1.

Furthermore, the first back gate transistor Q5a may include a back gate electrode, and the back gate electrode and the first back gate node N2a may be connected to each other.

As shown in FIG. 21, the second back gate voltage generation circuit 302A includes a second back gate node N2b, a second back gate transistor Q5b, and a second back gate capacitor element C2b.

The second back gate node N2b is connected to the back gate electrode of the second transistor Q2. That is, the node to which the back gate electrode of the second transistor Q2 is connected is defined as the "second back gate node N2b".

The second back gate capacitor element C2b is connected between the gate electrode and the source electrode of the second back gate transistor Q5b. In addition, the drain electrode of the second back gate transistor Q5b is connected to the back gate electrode of the second transistor Q2.

As shown in FIG. 21, the drain electrode of the second back gate transistor Q5b is connected to the second power supply terminal S1. The gate electrode of the second back gate transistor Q5b is connected to the gate electrode of the second transistor Q2.

Furthermore, the second back gate transistor Q5b may include a back gate electrode, and the back gate electrode and the second back gate node N2b may be connected to each other.

As shown in FIG. 21, the third back gate voltage generation circuit 303A includes a third back gate node N2c, a third back gate transistor Q5c, and a third back gate capacitor element C2c.

The third back gate node N2c is connected to the back gate electrode of the third transistor Q3. That is, the node to which the back gate electrode of the third transistor Q3 is connected is defined as the "third back gate node N2c".

The third back gate capacitor element C2c is connected between the gate electrode and the drain electrode of the third back gate transistor Q5c. In addition, the drain electrode of the third back gate transistor Q5c is connected to the back gate electrode of the third transistor Q3.

As shown in FIG. 21, the source electrode of the third back gate transistor Q5c is connected to the first power supply terminal S2. The gate electrode of the third back gate transistor Q5c is connected to the gate electrode of the third transistor Q3.

Furthermore, the third back gate transistor Q5c may include a back gate electrode, and the back gate electrode and the third back gate node N2c may be connected to each other.

As shown in FIG. 21, the fourth back gate voltage generation circuit 304A includes a fourth back gate node N2d, a fourth back gate transistor Q5d, and a fourth back gate capacitor element C2d.

The fourth back gate node N2d is connected to the back gate electrode of the fourth transistor Q4. That is, the node to which the back gate electrode of the fourth transistor Q4 is connected is defined as the "fourth back gate node N2d".

The fourth back gate capacitor element C2d is connected between the gate electrode and the drain electrode of the fourth back gate transistor Q5d. In addition, the drain electrode of the fourth back gate transistor Q5d is connected to the back gate electrode of the fourth transistor Q4.

As shown in FIG. 21, the source electrode of the fourth back gate transistor Q5d is connected to the first power supply terminal S2. The gate electrode of the fourth back gate transistor Q5d is connected to the gate electrode of the fourth transistor Q4.

Furthermore, the fourth back gate transistor Q5d may include a back gate electrode, and the back gate electrode and the fourth back gate node N2d may be connected to each other.

In the fifth embodiment, since the configuration of the liquid crystal display device and the configuration of the shift register circuit 1 are the same as those of the first embodiment (FIGS. 1 and 2), the description thereof will be omitted.

Figure 22:
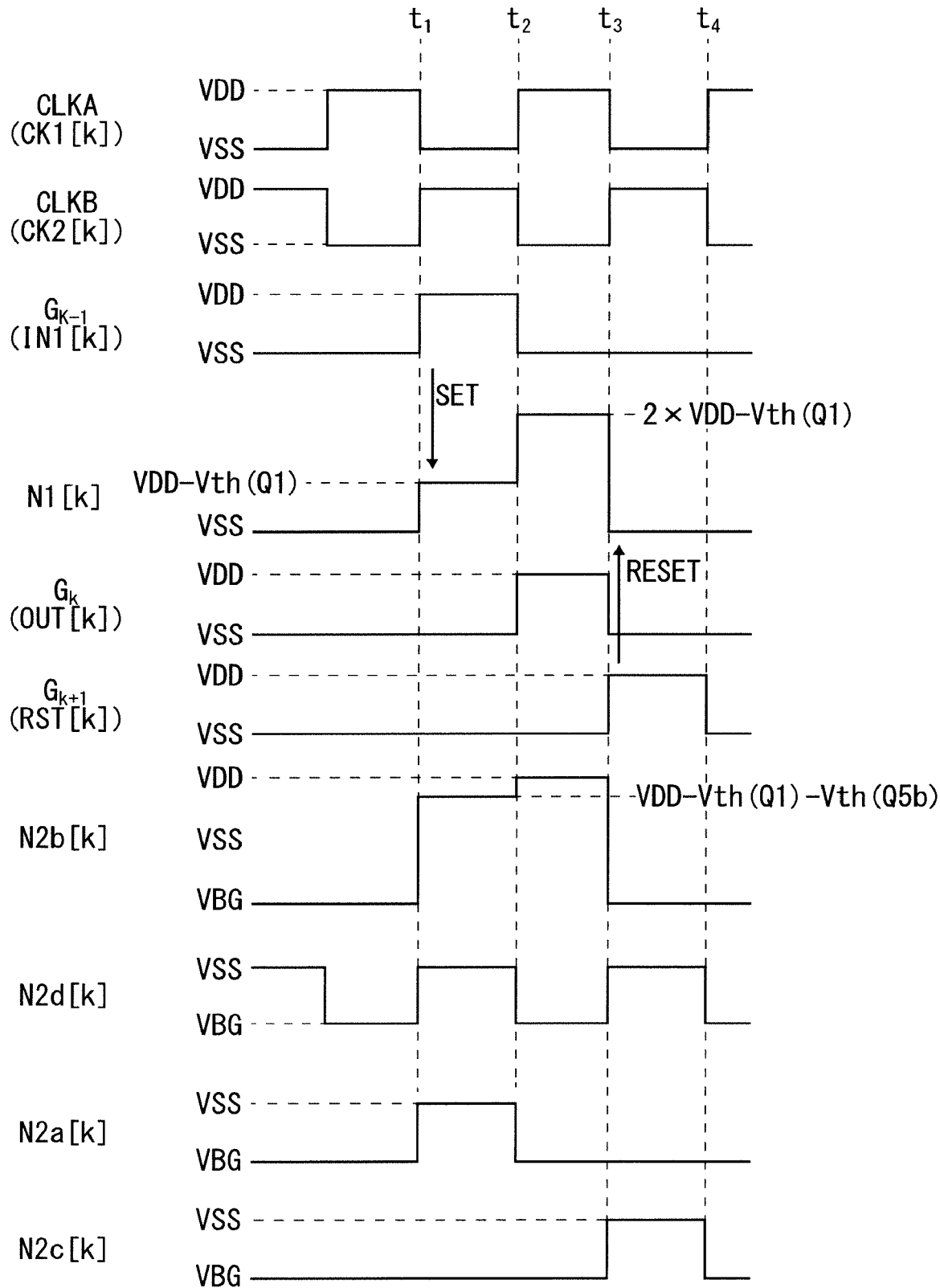
FIG. 22 is a diagram showing operation timing of the unit shift register according to the fifth embodiment.

FIG. 22 is a diagram showing the operation timing of the unit shift register SR (FIG. 21) in the fifth embodiment. First, as an initial state of the unit shift register $SR_k$, it is assumed that the control node N1 is at the L level. In addition, it is assumed that the input terminal IN1 (the output signal of the preceding stage $G_{k-1}$), the reset terminal RST (the output signal of the next stage $G_{k+1}$), the clock terminal CK1 (the clock signal CLKA), and the output terminal OUT (output signal $G_k$) are all at the L level.

At the time $t_1$, when the clock signal CLKA changes to the L level, the clock signal CLKB changes to the H level, and the output signal $G_{k-1}$ (the start pulse ST in the case of the first stage) of the unit shift register $SR_{k-1}$ of the preceding stage goes to the H level, both the first transistor Q1 and the first back gate transistor Q5a are turned on. In addition, at the time $t_1$, the potential of the gate electrode of the second back gate transistor Q5b goes to VDD-Vth (Q1), whereby the second back gate transistor Q5b is turned on, and the potential of the second back gate node N2b goes to VDD-Vth (Q1)-Vth (Q5b), where, Vth (Q5b) is the threshold voltage of the second back gate transistor Q5b. In addition, at the time $t_1$, the fourth back gate transistor Q5d is also turned on, and the potentials of the first and fourth back gate nodes N2a and N2d go to VSS.

Then, at the time $t_2$, when the clock signal CLKB changes to the L level, the clock signal CLKA changes to the H level, and the output signal $G_{k-1}$ of the unit shift register $SR_{k-1}$ of the preceding stage goes to the L level, both the first transistor Q1 and the first back gate transistor Q5a are turned off. Thus, the potential of the back gate electrode of the first transistor Q1 is lowered to the potential VBGa lower than the potential VSS by the first back gate capacitor element C2a.

Since the second transistor Q2 is turned on at the time $t_2$, the level of the output terminal OUT rises following the clock signal CLKA, and the output signal $G_k$ goes to the H level. When the level of the clock terminal CK1 and the level of the output terminal OUT rise, the level of the control node N1 is boosted due to the coupling through the capacitor element C1 and the capacitor between the gate and the channel of the second transistor Q2. That is, a higher voltage due to the control node N1 is input into the gate electrode of the second back gate transistor Q5b, and the potential goes to the VDD.

In addition, at the time $t_2$, the fourth transistor Q4 and the fourth back gate transistor Q5d are turned off. Thus, the potential of the back gate electrode of the fourth transistor Q4 is lowered to the potential VBGd lower than the potential VSS by the fourth back gate capacitor element C2d.

At the time $t_3$, since the output signal $G_{k+1}$ of the unit shift register $SR_{k+1}$ of the next stage input into the reset terminal RST and the clock signal CLKB go to the H level, the third transistor Q3 of the charge and discharge circuit 200 and the fourth transistor Q4 of the output circuit 100A are turned on. As a result, since the output terminal OUT is sufficiently discharged through the fourth transistor Q4, the output signal $G_k$ reliably goes to the L level (VSS). In addition, the control node N1 is discharged by the third transistor Q3 to the L level. That is, at the time $t_3$, the unit shift register $SR_k$ changes from the set state to the reset state.

At the time $t_3$, the second transistor Q2 and the second back gate transistor Q5b are turned off. Thus, the potential of the back gate electrode of the second transistor Q2 is lowered to the potential VBGb lower than the potential VSS by the second back gate capacitor element C2b.

Then, after the output signal $G_{k+1}$ of the unit shift register $SR_{k+1}$ of the next stage returns to the L level at the time $t_4$, the unit shift register $SR_k$ is maintained in the reset state until the output signal $G_{k-1}$ of the unit shift register $SR_{k-1}$ of the preceding stage is input into the input terminal IN1. The output signal $G_k$ is kept at the L level.

At the time $t_4$, the third transistor Q3 and the third back gate transistor Q5c are turned off. Thus, the potential of the back gate electrode of the third transistor Q3 is lowered to the potential VBGc lower than the potential VSS by the third back gate capacitor element C2c.

As described above, a negative voltage is applied to the back gate electrode of each of the first to fourth transistors Q1, Q2, Q3, and Q4 only during the non-selection period. In addition, during the selection periods of the first, third, and fourth transistors Q1, Q3, and Q4, the respective back gate electrodes have the same potential as the VSS. During the selection period of the second transistor Q2, the back gate electrode has the same potential as the VDD.

Thus, it is possible to prevent the negative direction shift of the threshold voltages of the first to fourth transistors Q1, Q2, Q3, and Q4, and to prevent an increase in the leakage current during the non-selection periods of the first to fourth transistors Q1, Q2, Q3, and Q4. In addition, since the respective back gate electrodes go to the VSS during the selection periods of the first, third, and fourth transistors Q1, Q3, and Q4, it is possible to prevent an increase in the on-resistance due to the application of a negative voltage to the back gate electrodes during the selection periods. In addition, during the selection period of the second transistor Q2, the potential of the back gate electrode goes to the VDD larger than the VSS, so that it is possible to prevent an increase in the on-resistance of the second transistor Q2.

In addition, when a positive voltage is applied to each of the gate electrodes of the first to fourth transistors Q1, Q2, Q3, and Q4 for a predetermined period, the threshold voltage of the TFT is shifted in the positive direction. Thus, applying a negative voltage to the back gate electrode as in the fifth embodiment acts in a direction of pulling back the shift of the threshold voltage in the positive direction. This makes it possible to prevent the deterioration of the electrical characteristics of the transistor and to extend the life of the unit shift register SR and the shift register circuit 1.

Figure 23:
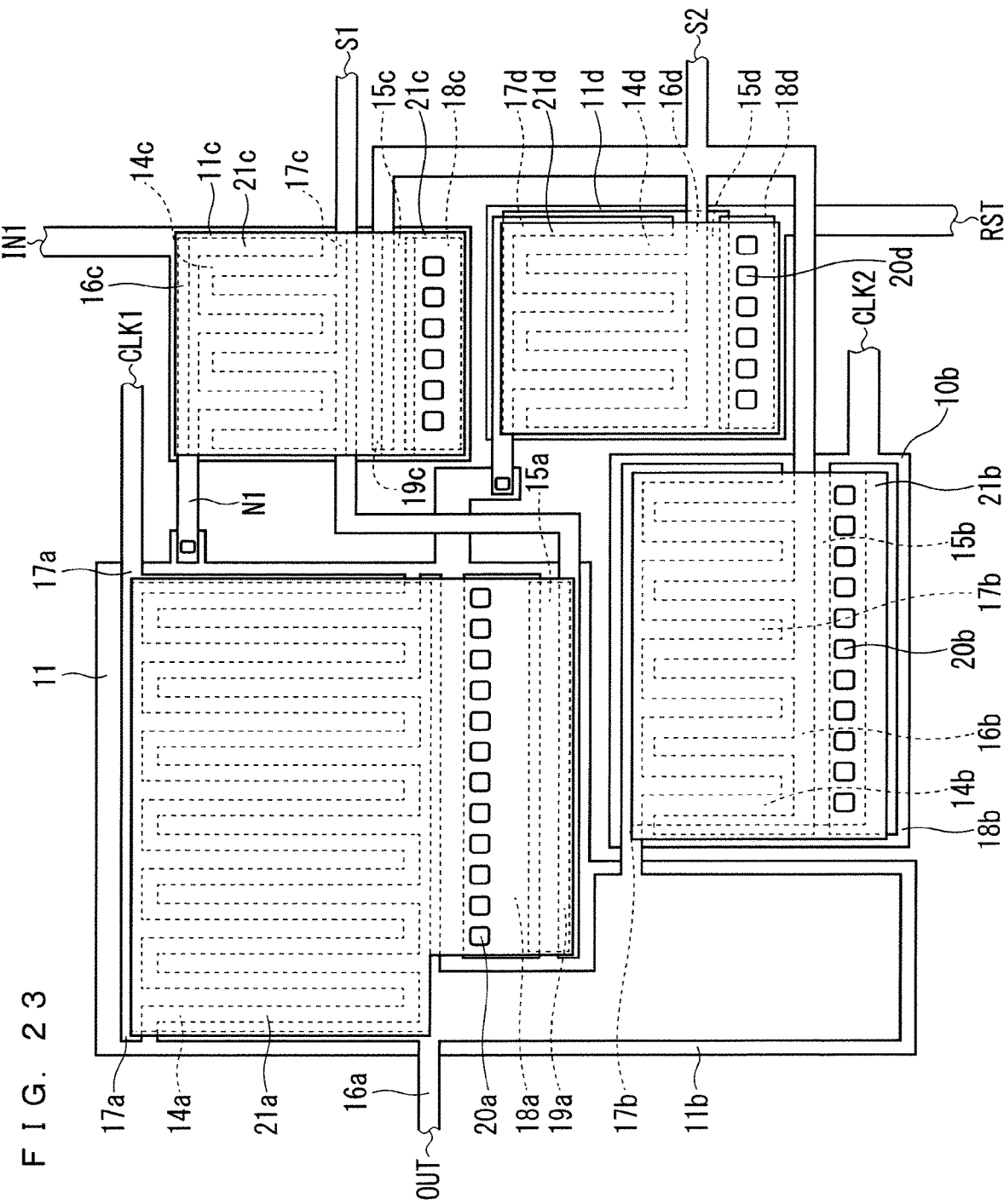
FIG. 23 is a plan view of first to fourth transistors and first to fourth back gate voltage generation circuits according to the fifth embodiment.

FIG. 23 is a plan view of the first to fourth transistors Q1, Q2, Q3, and Q4 and the first to fourth back gate voltage generation circuits in the present embodiment.

As shown in FIG. 23, a gate electrode 11a common to the first transistor Q1 and the first back gate transistor Q5a is formed on a glass substrate (not shown). In the first transistor Q1, the semiconductor layer 14a, the drain electrode 17a, and the source electrode 16a are formed over the gate electrode 11a via the insulating film (not shown). In addition, in the first transistor Q1, a back gate electrode 21a is formed opposite to the drain electrode 17a and the source electrode 16a via the liquid crystal (not shown).

In the first back gate transistor Q5a, the semiconductor layer 15a, the drain electrode 18a, and the source electrode 19a are formed over the gate electrode 11 via the insulating film (not shown).

In the contact hole 20a, the back gate electrode 21a of the first transistor Q1 and the drain electrode 18a of the first back gate transistor Q5a are connected to each other. The back gate electrode 21a corresponds to the back gate node N2a. In addition, a first back gate capacitor element C2a is formed in a region where the drain electrode 18a and the gate electrode 11a overlap in a plan view.

As shown in FIG. 23, a gate electrode 11b common to the second transistor Q2 and the second back gate transistor Q5b is formed on a glass substrate (not shown). In the second transistor Q2, the semiconductor layer 14b, the drain electrode 17b, and the source electrode 16b are formed over the gate electrode 11b via the insulating film (not shown). In addition, in the second transistor Q2, a back gate electrode 21b is formed opposite to the drain electrode 17b and the source electrode 16b via the liquid crystal (not shown).

In the second back gate transistor Q5b, the semiconductor layer 15b, the drain electrode 18b, and the source electrode 19b are formed over the gate electrode 11b via the insulating film (not shown).

In the contact hole 20b, the back gate electrode 21b of the second transistor Q2 and the drain electrode 18b of the second back gate transistor Q5b are connected to each other. The back gate electrode 21b corresponds to the back gate node N2b. In addition, a second back gate capacitor element C2b is formed in a region where the drain electrode 18b and the gate electrode 11b overlap in a plan view.

As shown in FIG. 23, a gate electrode 11c common to the third transistor Q3 and the third back gate transistor Q5c is formed on a glass substrate (not shown). In the third transistor Q3, the semiconductor layer 14c, the drain electrode 17c, and the source electrode 16c are formed over the gate electrode 11c via the insulating film (not shown). In addition, in the third transistor Q3, a back gate electrode 21c is formed opposite to the drain electrode 17c and the source electrode 16c via the liquid crystal (not shown).

In the third back gate transistor Q5c, the semiconductor layer 15c, the drain electrode 18c, and the source electrode 19c are formed over the gate electrode 11c via the insulating film (not shown).

In the contact hole 20c, the back gate electrode 21c of the third transistor Q3 and the drain electrode 18c of the third back gate transistor Q5c are connected to each other. The back gate electrode 21c corresponds to the back gate node N2c. In addition, a third back gate capacitor element C2c is formed in a region where the drain electrode 18c and the gate electrode 11c overlap in a plan view.

As shown in FIG. 23, a gate electrode 11d common to the fourth transistor Q4 and the fourth back gate transistor Q5d is formed on a glass substrate (not shown). In the fourth transistor Q4, the semiconductor layer 14d, the drain electrode 17d, and the source electrode 16d are formed over the gate electrode 11d via the insulating film (not shown). In addition, in the fourth transistor Q4, a back gate electrode 21d is formed opposite to the drain electrode 17d and the source electrode 16d via the liquid crystal (not shown).

In the fourth back gate transistor Q5d, the semiconductor layer 15d, the drain electrode 18d, and the source electrode 19d are formed over the gate electrode 11d via the insulating film (not shown).

In the contact hole 20d, the back gate electrode 21d of the fourth transistor Q4 and the drain electrode 18d of the fourth back gate transistor Q5d are connected to each other. The back gate electrode 21d corresponds to the back gate node N2d. In addition, a fourth back gate capacitor element C2d is formed in a region where the drain electrode 18d and the gate electrode 11d overlap in a plan view.

In addition, the second back gate capacitor element C2b is connected to the second power supply terminal S1 having the potential VDD, and the first, third, and fourth back gate capacitor elements C2a, C2c, and C2d are connected to the first power supply terminal S2 having the potential VSS.

As described above, in the fifth embodiment, in the first to fourth transistors Q1, Q2, Q3, and Q4, the malfunction when the TFT is normally on is prevented and an increase in on-resistance is also prevented, so that it is possible to achieve the unit shift register SR and the shift register circuit 1 capable of stable operations.

It should be noted that in the fifth embodiment, the source electrode of only the second back gate transistor Q5b of the first to fourth back gate transistors Q5a, Q5b, Q5c, and Q5d is supplied with the potential VDD, but as in the first, third, and fourth transistors Q5a, Q5c, and Q5d, the source electrode may be supplied with the potential VSS. Also in this configuration, similarly, it is possible to prevent the occurrence of a leakage current even if the second transistor Q2 is a normally-on TFT.

Effect

The unit shift register SR included in the shift register circuit 1 in the fifth embodiment further includes an input terminal IN1 into which a signal output from the output terminal OUT of the unit shift register $SR_{k-1}$ of the preceding stage is input, at least one transistor includes a first transistor Q1, the charge and discharge circuit 200 includes the first transistor Q1 for charging the control node N1, the first transistor Q1 is connected between the second power supply terminal S1 and the control node N1, the gate electrode of the first transistor Q1 is connected to the input terminal IN1, the back gate electrode of the first transistor Q1 is connected to the back gate node (that is, the first back gate node N2a) of the back gate voltage generation circuit (that is, the first back gate voltage generation circuit 301A), a back gate capacitor element (that is, the first back gate capacitor element C2a) is connected between the gate electrode of the back gate transistor (that is, the first back gate transistor Q5a) and the source electrode or drain electrode of the back gate transistor, an electrode to which a back gate capacitor element is connected of the source electrode or the drain electrode of the back gate transistor is connected to the back gate node, the source electrode or the drain electrode of the back gate transistor is connected to the first power supply terminal S2, and the gate electrode of the back gate transistor is connected to the gate electrode of the first transistor Q1.

In the fifth embodiment, the first back gate transistor Q5a is turned off in conjunction with the turning off of the first transistor Q1. Thus, the potential of the back gate electrode of the first transistor Q1 is lowered to the potential VBGa lower than the potential VSS of the first power supply terminal S2 by the first back gate capacitor element C2a. In addition, since the first back gate transistor Q5a is turned on in conjunction with the turning on of the first transistor Q1, the back gate electrode of the first transistor Q1 has the same potential as the potential VSS of the first power supply terminal S2.

Therefore, it is possible to prevent an increase in a leakage current during the non-selection period of the first transistor Q1. In addition, during the selection period of the first transistor Q1, it is possible to prevent an increase in on-resistance due to the application of a negative voltage to the back gate electrode.

In addition, in the unit shift register SR included in the shift register circuit 1 in the fifth embodiment, at least one transistor includes a second transistor Q2, the output circuit 100A includes a second transistor Q2, the second transistor Q2 is connected between the clock terminal CK1 and the output terminal OUT, the gate electrode of the second transistor Q2 is connected to the control node N1, the back gate electrode of the second transistor Q2 is connected to the back gate node N2b of the back gate voltage generation circuit (that is, the second back gate voltage generation circuit 302A), a back gate capacitor element (that is, a second back gate capacitor element C2b) is connected between the gate electrode of the back gate transistor (that is, the second back gate transistor Q5b) and the source electrode or the drain electrode of the back gate transistor, an electrode to which the back gate capacitor element is connected of the source electrode or the drain electrode of the back gate transistor is connected to the back gate node (that is, the second back gate node N2b), the source electrode or the drain electrode of the back gate transistor is connected to the second power supply terminal S1, and the gate electrode of the back gate transistor is connected to the gate electrode of the second transistor Q2.

In the fifth embodiment, the second back gate transistor Q5b is turned off in conjunction with the turning off of the second transistor Q2. Thus, the potential of the back gate electrode of the second transistor Q2 is lowered to the potential VBGb lower than the potential VSS of the first power supply terminal S2 by the second back gate capacitor element C2b. In addition, since the second back gate transistor Q5b is turned on in conjunction with the turning on of the second transistor Q2, the back gate electrode of the second transistor Q2 has the same potential as the potential VDD of the second power supply terminal S1.

Therefore, it is possible to prevent an increase in a leakage current during the non-selection period of the second transistor Q2. In addition, during the selection period of the second transistor Q2, it is possible to prevent an increase in on-resistance due to the application of a negative voltage to the back gate electrode.

In addition, the unit shift register SR included in the shift register circuit 1 in the fifth embodiment further includes a reset terminal RST into which a signal output from the output terminal OUT of the unit shift register $SR_{k+1}$ of the next stage is input, at least one transistor includes a third transistor Q3, the charge and discharge circuit 200A includes a third transistor Q3 for discharging the control node N1, the third transistor Q3 is connected between the control node N1 and the first power supply terminal S2, the gate electrode of the third transistor Q3 is connected to the reset terminal RST, the back gate electrode of the third transistor Q3 is connected to the back gate node (that is, the third back gate node N2c) of the back gate voltage generation circuit (that is, the third back gate voltage generation circuit 303A), a back gate capacitor element (that is, the third back gate capacitor element C2c) is connected between the gate electrode of the back gate transistor (that is, the third back gate transistor Q5c) and the source electrode or the drain electrode of the back gate transistor, an electrode to which a back gate capacitor element is connected of the source electrode or the drain electrode of the back gate transistor is connected to the back gate node, the source electrode or the drain electrode of the back gate transistor is connected to the first power supply terminal S2, and the gate electrode of the back gate transistor is connected to the gate electrode of the third transistor Q3.

In the fifth embodiment, the third back gate transistor Q5c is turned off in conjunction with the turning off of the third transistor Q3. Thus, the potential of the back gate electrode of the third transistor Q3 is lowered to the potential VBGc lower than the potential VSS of the first power supply terminal S2 by the third back gate capacitor element C2c. In addition, since the third back gate transistor Q5c is turned on in conjunction with the turning on of the third transistor Q3, the back gate electrode of the third transistor Q3 has the same potential as the potential VSS of the first power supply terminal S2.

Therefore, it is possible to prevent an increase in a leakage current during the non-selection period of the third transistor Q3. In addition, during the selection period of the third transistor Q3, it is possible to prevent an increase in on-resistance due to the application of a negative voltage to the back gate electrode.

In addition, in the unit shift register SR included in the shift register circuit 1 in the fifth embodiment, at least one transistor includes a fourth transistor Q4, the output circuit 100A further includes a fourth transistor Q4, the fourth transistor Q4 is connected between the output terminal OUT and the first power supply terminal S2, a clock signal having a phase opposite to that of the clock signal input into the clock terminal CK1 is input into the gate electrode of the fourth transistor Q4, the back gate electrode of the fourth transistor Q4 is connected to the back gate node (that is, the fourth back gate node N2d) of the back gate voltage generation circuit (that is, the fourth back gate voltage generation circuit 304A), a back gate capacitor element (that is, the fourth back gate capacitor element C2d) is connected between the gate electrode of the back gate transistor (that is, the fourth back gate transistor Q5d) and the source electrode or the drain electrode of the back gate transistor, an electrode to which a back gate capacitor element is connected of the source electrode or the drain electrode of the back gate transistor is connected to the back gate node, the source electrode or the drain electrode of the back gate transistor is connected to the first power supply terminal S2, and the gate electrode of the back gate transistor is connected to the gate electrode of the fourth transistor Q4.

In the fifth embodiment, the fourth back gate transistor Q5d is turned off in conjunction with the turning off of the fourth transistor Q4. Thus, the potential of the back gate electrode of the fourth transistor Q4 is lowered to the potential VBGd lower than the potential VSS of the first power supply terminal S2 by the fourth back gate capacitor element C2d. In addition, since the fourth back gate transistor Q5d is turned on in conjunction with the turning on of the fourth transistor Q4, the back gate electrode of the fourth transistor Q4 has the same potential as the potential VSS of the first power supply terminal S2.

Therefore, it is possible to prevent an increase in a leakage current during the non-selection period of the fourth transistor Q4. In addition, during the selection period of the fourth transistor Q4, it is possible to prevent an increase in on-resistance due to the application of a negative voltage to the back gate electrode.

Sixth Embodiment

In the unit shift register SR in the first to fifth embodiments, an example of the shift register SR including the second power supply terminal S1 on the high potential side and the first power supply terminal S2 on the low potential side is described as the constant voltage source. In the sixth embodiment, as the constant voltage source, a shift register SR including the first power supply terminal S2 on the low potential side without the second power supply terminal S1 on the high potential side will be described.

Figure 24:
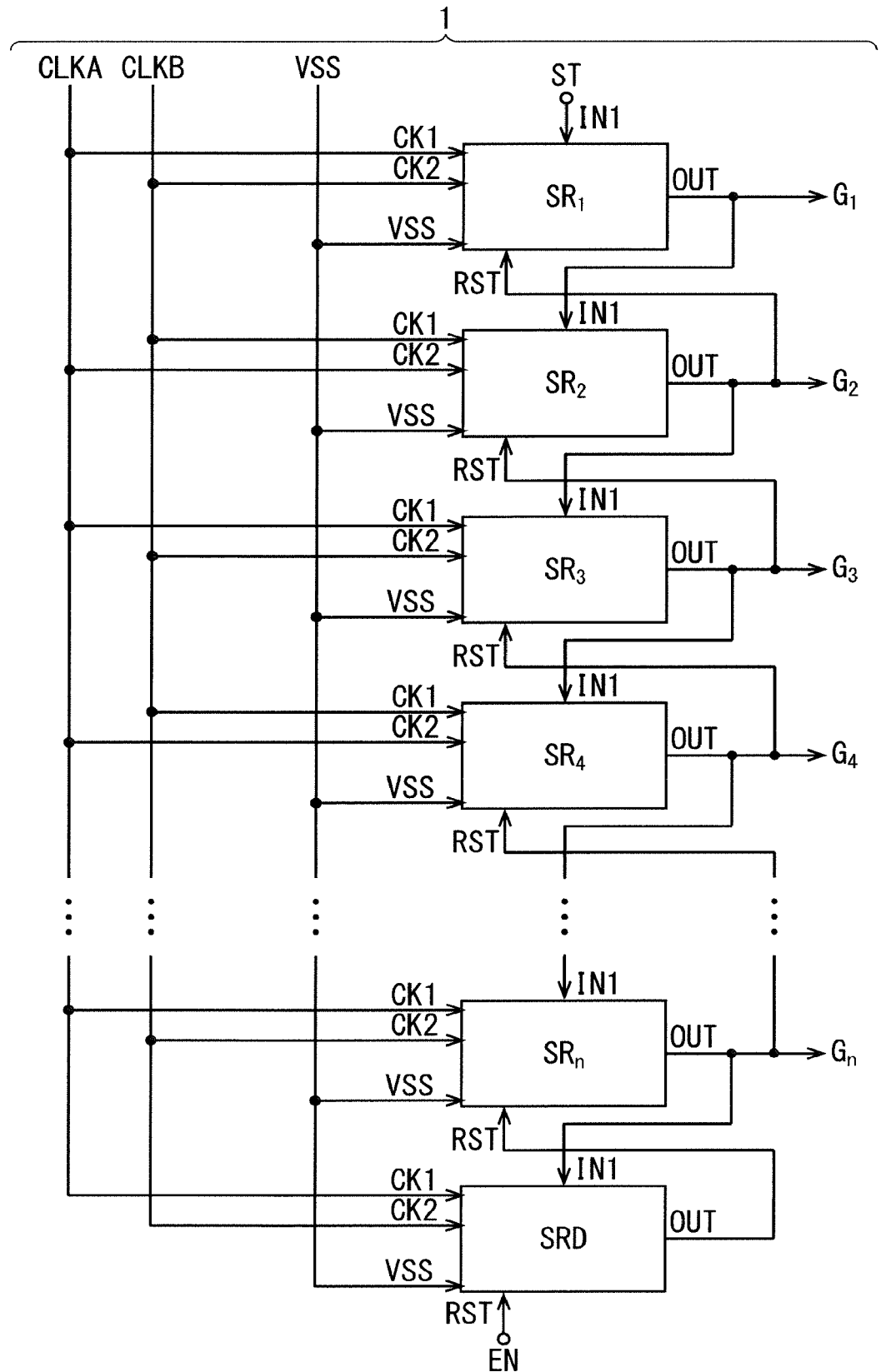
FIG. 24 is a diagram showing a configuration of a shift register circuit according to a sixth embodiment.

FIG. 24 is a diagram showing a configuration of a shift register circuit 1. As opposed to the configuration in FIG. 2 described in the first embodiment, there is no second power supply terminal S1 for supplying the constant power supply VDD on the high potential side. Since the other configurations are the same as those of the first embodiment (FIG. 3), the description thereof will be omitted.

FIG. 25 is a diagram showing a configuration of the unit shift register SRk of the k-th stage. As shown in FIG. 25, the unit shift register SRk includes an output terminal OUT, clock terminals CK1 and CK2, an input terminal IN1, a reset terminal RST, and a first power supply terminal S2. As opposed to the configuration shown in FIG. 4, the power supply terminal S1 is eliminated, and the input terminal IN1 and the drain of the transistor Q1 are connected to each other instead. Since the operation timing of the unit shift register SR of the sixth embodiment is the same as that shown in FIG. 7 described in the first embodiment, the description thereof will be omitted.

Figure 26:
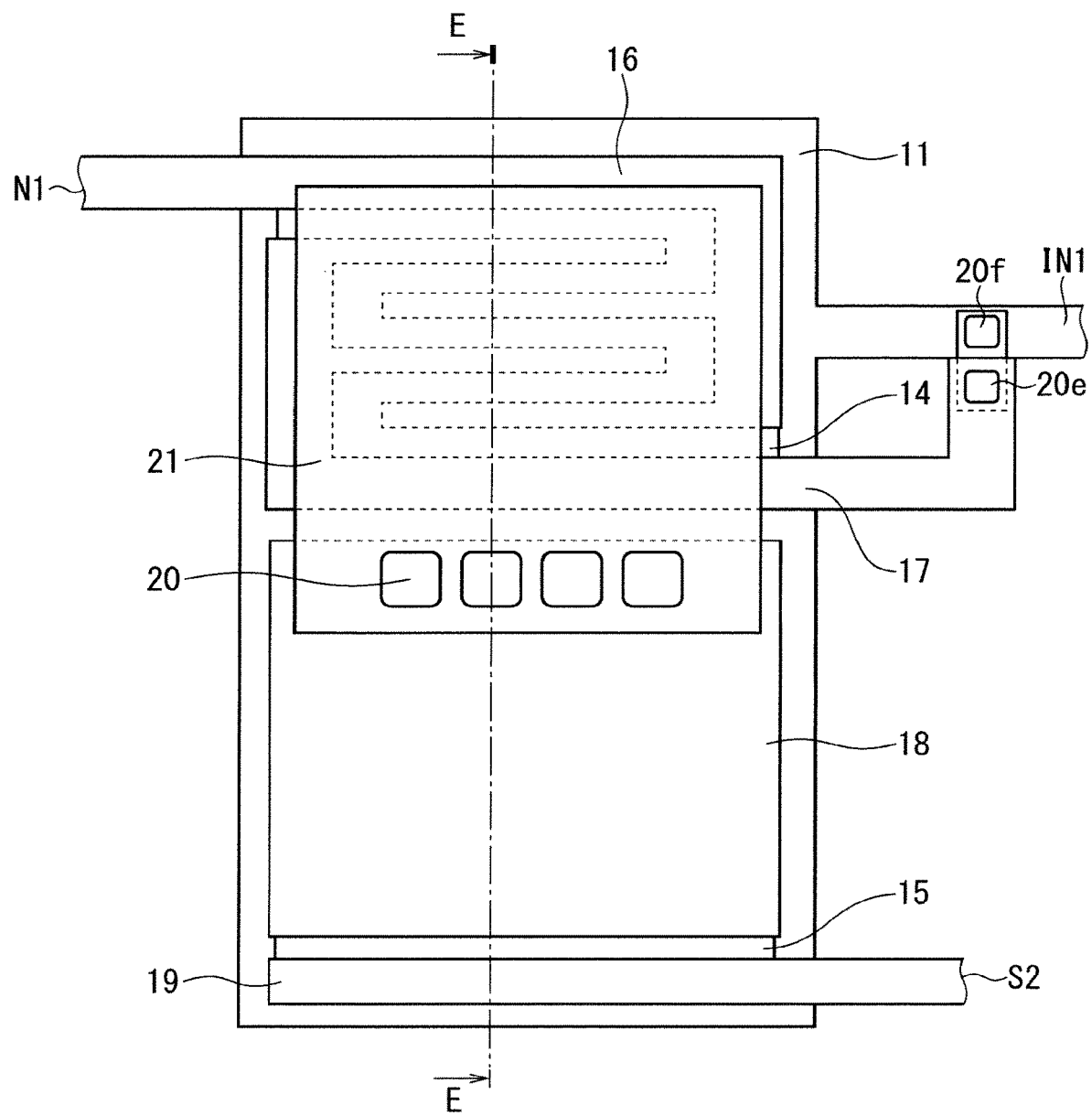
FIG. 26 is a plan view of a first transistor and a back gate voltage generation circuit according to the sixth embodiment.

Next, the configuration of the first transistor Q1 and the back gate voltage generation circuit 300 included in the charge and discharge circuit 200 of the unit shift register SR of the sixth embodiment will be described. FIG. 26 is a plan view of the first transistor Q1 and the back gate voltage generation circuit 300. In addition, since the cross-sectional view taken along line E-E in FIG. 26 is the same as the cross-sectional view in FIG. 9, the description of the cross-sectional view is omitted.

As shown in FIG. 26, in the sixth embodiment, the gate electrode 11 and the drain electrode 17 of the first transistor Q1 are electrically connected by the contact holes 20e and 20f Since the other configurations are the same as those of the first embodiment (FIGS. 8 and 9), the description thereof will be omitted. It should be noted that also in the second to fifth embodiments, as shown in the sixth embodiment, the first power supply terminal S2 may be provided without the second power supply terminal S1.

Effect

The shift register circuit 1 in the sixth embodiment is a shift register circuit including a plurality of unit shift registers SR cascade-connected in multistage; each of the plurality of unit shift registers SR includes: an output circuit 100, including a control node N1, for outputting an output signal $G_k$ synchronized with the clock signals CLKA and CLKB input into the clock terminals CK1 and CK2 to the output terminal OUT, a charge and discharge circuit 200 for charging and discharging the control node N1 of the output circuit 100, a first power supply terminal S2 for supplying a constant voltage VSS to the charge and discharge circuit 200, and at least one back gate voltage generation circuit 300; the output circuit 100 or the charge and discharge circuit 200 includes at least one transistor (a first transistor Q1 in the sixth embodiment) including a back gate electrode; the back gate voltage generation circuit 300 includes a back gate node N2; the back gate node N2 is connected to the back gate electrode of the transistor; the back gate voltage generation circuit 300 changes the voltage of the back gate node N2 according to the voltage of the gate electrode of the transistor; and a drive voltage is supplied to the back gate voltage generation circuit 300 from the first power supply terminal S2.

As described above, in the shift register circuit 1 in the sixth embodiment, each unit shift register SR does not include the second power supply terminal S1. This makes it possible to simplify the configuration of the unit shift register SR and prevent complication of the power supply circuit as compared with the first embodiment.

It should be noted that in the sixth embodiment, the first transistor Q1 includes a back gate electrode and a back gate voltage generation circuit 300 is connected to the back gate electrode of the first transistor Q1, but a transistor to which the back gate voltage generation circuit 300 is connected is not limited to the first transistor Q1. For example, any one of the second to fourth transistors Q2, Q3, and Q4 may include a back gate electrode, and the back gate voltage generation circuit 300 may be connected to the back gate electrode of the transistor.

In addition, in the unit shift register SR in each of the first to sixth embodiments, the semiconductor layer of the transistor including the back gate electrode contains oxide. Therefore, since using an oxide semiconductor for the semiconductor layer can prevent the occurrence of a leakage current due to hole conduction even when a negative voltage is applied to the back gate electrode, it is easier to reduce the power consumption due to the leak current and maintain the negative potential of the back gate node N2.

In addition, the unit shift register SR in each of the first to sixth embodiments is monolithically formed on a substrate (that is, the glass substrate 10). Monolithically forming the unit shift register SR on the glass substrate 10 can prevent an increase in the circuit area due to the addition of the back gate electrode and the back gate voltage generation circuit.

In addition, in the unit shift register SR in each of the first to sixth embodiments, the transistors included in the output circuits 100 and 100A, the charge and discharge circuits 200 and 200A, and the back gate voltage generation circuits 300, 300A, 300B, 300C, 301A, 302A, 303A, and 304A have the same conductivity type. Therefore, making the transistors included in the unit shift register SR the same conductivity type allows these transistors to be collectively formed in the same step, and an increase in the number of manufacturing steps to be prevented.

In addition, in each of the first to sixth embodiments, the display panel 2 includes a plurality of source lines, a plurality of gate lines orthogonal to the plurality of source lines, a plurality of pixel transistors arranged at intersections of the plurality of source lines and the plurality of gate lines, and a shift register circuit 1 of any one of the first to fifth embodiments; each of the output terminals OUT of a plurality of unit shift registers SR of the shift register circuit 1 is connected to each of the plurality of gate lines; and the source line, the gate line, the pixel transistor and the shift register circuit 1 are monolithically formed on the same substrate.

Therefore, in the step of forming the source line, the gate line, the pixel transistor, and the like on the substrate, it is possible to form a shift register circuit at the same time. Therefore, an increase in the number of manufacturing steps can be prevented.

In addition, in the display panel 2 in each of the first to sixth embodiments, the transistors included in the output circuits 100 and 100A, the charge and discharge circuits 200 and 200A, and the back gate voltage generation circuits 300, 300A, 300B, 300C, 301A, 302A, 303A, and 304A have the same conductivity type as the pixel transistors.

Therefore, causing the transistors included in the shift register circuit 1 and the pixel transistors to have the same conductivity type allows the transistors included in the shift register circuit 1 and the pixel transistors to be collectively formed in the same step, and an increase in the number of manufacturing steps to be prevented in the manufacture of the display panel 2.

It should be noted that in each of the first to sixth embodiments of the present invention, an example in which the output circuit 100 or 100A includes two TFTs of the second and fourth transistors Q2 and Q4 and one capacitor element C1 is shown, but each of the first to sixth embodiments of the present invention can be similarly applied to other configurations in which the numbers of transistors and capacitor elements are different. In addition, in the first to fifth embodiments, an example in which the charge and discharge circuit 200 or 200A includes two TFTs of the first and third transistors Q1 and Q3 is shown, but each of the first to fifth embodiments of the present invention can be similarly applied to other configurations in which the number of transistors is different.

In addition, in the present description, it is possible to configure a unit shift register SR by freely combining each of the first to sixth embodiments. For example, in the second embodiment, a back gate electrode is formed only in the first transistor Q1 and connected to the back gate voltage generation circuit 300. In addition, in the fifth embodiment, back gate electrodes are formed in the first to fourth transistors Q1, Q2, Q3, and Q4, and these respective back gate electrodes are connected to the back gate voltage generation circuits 301A, 301B, 301C, and 301D. The present description is not limited to these, and for example, a back gate electrode may be formed only in the second transistor Q2 and connected to the back gate voltage generation circuit. In addition, back gate electrodes may be formed only in the first and fourth transistors Q1 and Q4, and these respective back gate electrodes may be connected to the back gate voltage generation circuits. Thus, it is possible to form a back gate electrode for any transistor included in the unit shift register SR, and to connect a back gate voltage generation circuit to this back gate electrode.

In addition, for example, in the fourth embodiment, a voltage dividing capacitor element C3 is provided in the back gate voltage generation circuit 300C, and the voltage applied to the back gate node N2 is divided by the back gate capacitor element C2 and the voltage dividing capacitor element C3. Similarly to this, also in the fifth embodiment, voltage dividing capacitor elements may be provided in the respective back gate voltage generation circuits 301A, 301B, 301C, and 301D.

In addition, in each of the first to sixth embodiments, an example in which the shift register circuit 1 is applied to a liquid crystal display device is described, but the shift register circuit 1 can be widely applied to a display device using a shift register such as an organic electroluminescence (EL) display device or a micro electro-mechanical system (MEMS) display device.

In addition, specific embodiments or examples made in the detailed description of the invention only clarify the technical contents of the present invention, should not be narrowly construed as being limited only to such specific examples, and can be implemented with various modifications within the spirit of the present invention and the scope of the following claims.

It should be noted that in the present invention, each embodiment can be freely combined, and each embodiment can be appropriately modified, or omitted within the scope of the present invention. Although the present invention is described in detail, the above description is in all aspects exemplification, and the present invention is not limited to the above description. It is understood that innumerable modifications not illustrated can be envisaged without departing from the scope of the present invention.

EXPLANATION OF REFERENCE SIGNS

1: shift register circuit
2: display panel
2a: display region
3: flexible printed circuit board
4: control board
5: gate line drive circuit
6: source line drive circuit
7: auxiliary capacitor wiring line
SR, $SR_1$, $SR_2$, $SR_n$, $SR_k$, $SR_{k-1}$, $SR_{k+1}$: unit shift register
Q1: first transistor
Q2: second transistor
Q3: third transistor
Q4: fourth transistor
Q5: back gate transistor
Q5a: first back gate transistor
Q5b: second back gate transistor
Q5c: third back gate transistor
Q5d: fourth back gate transistor
C1: capacitor element
C2: back gate capacitor element
C2a: first back gate capacitor element
C2b: second back gate capacitor element
C2c: third back gate capacitor element
C2d: fourth back gate capacitor element
C3, C4: voltage dividing capacitor element
100, 100A: output circuit
200, 200A: charge and discharge circuit
300, 300A, 3008, 300C: back gate voltage generation circuit
301A: first back gate voltage generation circuit
302A: second back gate voltage generation circuit
303A: third back gate voltage generation circuit 304A: fourth back gate voltage generation circuit
S1: second power supply terminal
S2: first power supply terminal
CK1, CK2: clock terminal
RST: reset terminal
OUT: output terminal

The invention claimed is:

1. A shift register circuit comprising a plurality of unit shift registers cascade-connected in multistage,
wherein each of the plurality of unit shift registers includes:
an output circuit including a control node, the output circuit configured to output an output signal synchronized with clock signals input into clock terminals to an output terminal,
a charge and discharge circuit configured to charge and discharge the control node of the output circuit,
a first power supply terminal configured to supply a first power supply voltage to the charge and discharge circuit, and
at least one back gate voltage generation circuit,
wherein the output circuit or the charge and discharge circuit includes at least one transistor including a back gate electrode,
wherein the back gate voltage generation circuit includes a back gate node,
wherein the back gate node is connected to the back gate electrode of the transistor,
wherein the back gate voltage generation circuit changes a voltage of the back gate node according to a voltage of a gate electrode of the transistor,
wherein the shift register circuit further comprises a second power supply terminal having a higher potential than the first power supply terminal, the second power supply terminal configured to supply a second power supply voltage on a high potential side to the charge and discharge circuit,
wherein the back gate voltage generation circuit is supplied with a drive voltage from the first or second power supply terminal,
wherein the back gate voltage generation circuit includes:
a back gate transistor, and
a back gate capacitor element,
wherein the back gate capacitor element is connected between a gate electrode of the back gate transistor and a source electrode or a drain electrode of the back gate transistor,
wherein an electrode to which the back gate capacitor element is connected of the source electrode or the drain electrode of the back gate transistor is connected to the back gate node,
wherein the source electrode or the drain electrode of the back gate transistor is connected to the first or second power supply terminal,
wherein the back gate transistor is a thin film transistor,
wherein the gate electrode of the back gate transistor is arranged on a substrate,
wherein the drain electrode and the source electrode of the back gate transistor are arranged in an upper layer of the gate electrode via a gate insulating layer, and
wherein the back gate capacitor element includes a region where the gate electrode and the source electrode or the drain electrode overlap in a plan view.

2. The shift register circuit according to claim 1, wherein the back gate voltage generation circuit increases a voltage of the back gate node while the transistor is selected, and decreases a voltage of the back gate node while the transistor is not selected.

3. The shift register circuit according to claim 1, wherein the gate electrode of the back gate transistor is connected to the gate electrode of the transistor.

4. The shift register circuit according to claim 1,
wherein the back gate transistor includes a back gate electrode, and
wherein the back gate electrode of the back gate transistor is connected to the back gate node.

5. The shift register circuit according to claim 1,
wherein the back gate voltage generation circuit further includes a voltage dividing capacitor element, and
wherein the voltage dividing capacitor element is connected between the back gate node and a voltage source.

6. The shift register circuit according to claim 1, wherein a semiconductor layer of the transistor including the back gate electrode contains oxide.

7. The shift register circuit according to claim 3,
further comprising an input terminal into which a signal output from the output terminal of the unit shift register of a preceding stage is input,
wherein the at least one transistor includes a first transistor,
wherein the charge and discharge circuit includes the first transistor configured to charge the control node,
wherein the first transistor is connected between the second power supply terminal and the control node,
wherein a gate electrode of the first transistor is connected to the input terminal,
wherein the back gate electrode of the first transistor is connected to the back gate node of the back gate voltage generation circuit,
wherein the back gate capacitor element is connected between a gate electrode of the back gate transistor and a source electrode or a drain electrode of the back gate transistor,
wherein an electrode to which the back gate capacitor element is connected of the source electrode or the drain electrode of the back gate transistor is connected to the back gate node,
wherein the source electrode or the drain electrode of the back gate transistor is connected to the first power supply terminal, and
wherein the gate electrode of the back gate transistor is connected to the gate electrode of the first transistor.

8. The shift register circuit according to claim 3,
wherein the at least one transistor includes a second transistor,
wherein the output circuit includes the second transistor,
wherein the second transistor is connected between the clock terminal and the output terminal,
wherein a gate electrode of the second transistor is connected to the control node,
wherein a back gate electrode of the second transistor is connected to the back gate node of the back gate voltage generation circuit,
wherein the back gate capacitor element is connected between a gate electrode of the back gate transistor and a source electrode or a drain electrode of the back gate transistor,
wherein an electrode to which the back gate capacitor element is connected of the source electrode or the drain electrode of the back gate transistor is connected to the back gate node, wherein the source electrode or the drain electrode of the back gate transistor is connected to the second power supply terminal, and wherein the gate electrode of the back gate transistor is connected to the gate electrode of the second transistor.

9. The shift register circuit according to claim 3, further comprising a reset terminal into which a signal output from the output terminal of the unit shift register of a next stage is input, wherein the at least one transistor includes a third transistor, wherein the charge and discharge circuit includes the third transistor configured to discharge the control node, wherein the third transistor is connected between the control node and the first power supply terminal, wherein a gate electrode of the third transistor is connected to the reset terminal, wherein a back gate electrode of the third transistor is connected to the back gate node of the back gate voltage generation circuit, wherein the back gate capacitor element is connected between a gate electrode of the back gate transistor and a source electrode or a drain electrode of the back gate transistor, wherein an electrode to which the back gate capacitor element is connected of the source electrode or the drain electrode of the back gate transistor is connected to the back gate node, wherein the source electrode or the drain electrode of the back gate transistor is connected to the first power supply terminal, and wherein the gate electrode of the back gate transistor is connected to the gate electrode of the third transistor.

10. The shift register circuit according to claim 3, wherein the at least one transistor includes a fourth transistor, wherein the output circuit further includes the fourth transistor, wherein the fourth transistor is connected between the output terminal and the first power supply terminal, wherein a clock signal having a phase opposite to a phase of the clock signal input into the clock terminal is input into a gate electrode of the fourth transistor, wherein a back gate electrode of the fourth transistor is connected to the back gate node of the back gate voltage generation circuit, wherein the back gate capacitor element is connected between a gate electrode of the back gate transistor and a source electrode or a drain electrode of the back gate transistor, wherein an electrode to which the back gate capacitor element is connected of the source electrode or the drain electrode of the back gate transistor is connected to the back gate node, wherein the source electrode or the drain electrode of the back gate transistor is connected to the first power supply terminal, and wherein the gate electrode of the back gate transistor is connected to the gate electrode of the fourth transistor.

11. The shift register circuit according to claim 1, wherein the shift register circuit is monolithically formed on a substrate.

12. The shift register circuit according to claim 1, wherein transistors included in the output circuit, the charge and discharge circuit, and the back gate voltage generation circuit have an identical conductivity type.

13. A display panel comprising:
a plurality of source lines;
a plurality of gate lines orthogonal to the plurality of source lines;
a plurality of pixel transistors arranged at intersections of the plurality of source lines and the plurality of gate lines; and
the shift register circuit according to claim 1,
wherein each of output terminals of the plurality of unit shift registers of the shift register circuit is connected to each of the plurality of gate lines, and
wherein the source line, the gate line, the pixel transistor, and the shift register circuit are monolithically formed on an identical substrate.

14. The display panel according to claim 13, wherein transistors included in the output circuit, the charge and discharge circuit, and the back gate voltage generation circuit have a conductivity type identical to the pixel transistors.

15. The shift register circuit according to claim 5,
wherein the back gate transistor is a thin film transistor, and
wherein the voltage dividing capacitor element includes a region where a back gate electrode and an uppermost layer electrode arranged in an upper layer of the back gate electrode via an insulating layer overlap in a plan view.

16. The shift register circuit according to claim 15, wherein the uppermost layer electrode is connected to the first or second power supply terminal.

17. The shift register circuit according to claim 15,
wherein the output terminals of the plurality of unit shift registers of the shift register circuit are connected to each of a plurality of gate lines included in a display panel, and
wherein the uppermost layer electrode is connected to a wiring line to which an auxiliary capacitor potential of the display panel is applied.

* * * * *